United States Patent [19]
Ikemasu et al.

[11] Patent Number: 5,973,349
[45] Date of Patent: *Oct. 26, 1999

[54] STACKED CAPACITOR SEMICONDUCTOR DEVICE

[75] Inventors: Shinichiro Ikemasu; Kouichi Hashimoto, both of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/767,325

[22] Filed: Dec. 16, 1996

Related U.S. Application Data

[62] Division of application No. 08/412,224, Mar. 27, 1995, Pat. No. 5,631,184, which is a continuation of application No. 08/031,182, Mar. 12, 1993, abandoned.

[30] Foreign Application Priority Data

Mar. 13, 1992 [JP] Japan ..................................... 4-055602
Oct. 9, 1992 [JP] Japan ..................................... 4-271283

[51] Int. Cl.⁶ ......................... H01L 27/108; H01L 29/41; H01L 29/78
[52] U.S. Cl. .......................... 257/307; 257/306; 257/308; 257/309
[58] Field of Search .................................. 257/306, 307, 257/308, 309

[56] References Cited

U.S. PATENT DOCUMENTS

| 4,801,560 | 1/1989 | Wood et al. | 437/195 |
| 4,839,311 | 6/1989 | Riley et al. | 437/228 |
| 5,135,883 | 8/1992 | Bae et al. | 437/52 |
| 5,155,657 | 10/1992 | Oehrlein et al. | 257/307 |
| 5,196,365 | 3/1993 | Gotou | 437/52 |
| 5,223,729 | 6/1993 | Kudoh et al. | 257/296 |
| 5,250,457 | 10/1993 | Dennison | 437/48 |
| 5,292,677 | 3/1994 | Dennison | 437/52 |

FOREIGN PATENT DOCUMENTS

| 1-147857 | 6/1989 | Japan . | |
| 5-48033 | 2/1993 | Japan | 257/308 |
| 5-55508 | 3/1993 | Japan | 257/308 |
| 5-152538 | 6/1993 | Japan | 257/308 |

OTHER PUBLICATIONS

Ogawa, *English Translation* of p. 2, col. 2, last line through p. 3, col. 4, line 7.

Ema et al., IDM Technical Digest, 1988, pp. 592–595, "3–Dimensional Stacked Capacitor Cell for 16M and 64M DRAMS".

Itabashi et al., IEDM Technical Digest, 1991, pp. 477–480, "A Split Wordline Cell For 16MB SRAM Using Polysilicon Sidewall Contacts".

*Primary Examiner*—Jerome Jackson, Jr.
*Attorney, Agent, or Firm*—Nikaido, Marmelstein, Murray & Oram LLP

[57] ABSTRACT

A semiconductor device is made up of a substrate having a top surface, and a fin type capacitor having a first electrode including a first part which extends upwards from the substrate and a second part which extends approximately parallel to the top surface of the substrate from the first part. The second part is made up of at least one conductor layer.

14 Claims, 18 Drawing Sheets

STACKED CAPACITOR SEMICONDUCTOR DEVICE

This is a division of application Ser. No. 08/412,224, filed Mar. 27, 1995, now issued as U.S. Pat. No. 5,631,184, which is a continuation of application Ser. No. 08/031,182, filed Mar. 12, 1993 abandoned.

BACKGROUND OF THE INVENTION

The present invention generally relates to semiconductor devices and method of producing the same, and more particularly to a semiconductor device having a stacked structure made up of conductor and insulator layers such as a stacked type capacitor, and to a method of producing such a semiconductor device.

Recently, in DRAMs which have become important in information processing systems such as computers, the formation of a capacitor having a large storage capacitance has become an important problem to be solved. However, as the size of the DRAM decreases with higher integration density, the area of one cell inevitably decreases. For this reason, three dimensional cells such as the stacked type capacitor and the trench type capacitor have been proposed for the purpose of securing a sufficient storage capacitance within a limited area. A fin type capacitor which is a kind of stacked type capacitor seems promising in that a storage capacitor of a large capacity DRAM having a memory capacity of 16 M or greater can be realized. For example, the fin type capacitor is proposed in IEDM Technical Digest, 1988, p.592.

FIG. 1(A) through FIG. 1(C) are diagrams explaining the construction of a conventional fin type capacitor.

In FIG. 1(A) through FIG. 1(C), there are shown a semiconductor substrate 21, a LOCOS oxide layer 22, a gate oxide layer 23, a gate electrode (word line) 24, a source region 25, a drain region 26, a word line 27 of another cell, an interlayer insulator 28, fin type storage electrodes 29-1, 29-2 and 29-3, a dielectric layer 30, and an opposing electrode 31.

FIG. 1(A) shows the construction of one cell of a DRAM having a fin type capacitor which has one fin type storage electrode.

In this DRAM, the LOCOS oxide layer 22 which sections an element forming region is formed on the semiconductor substrate 21, and the gate oxide layer 23 is formed on this element forming region, as shown in FIG. 1(A). The gate electrode 24 which becomes the word line is formed on the gate oxide layer 23, and the word line 27 of the other cell is formed on the LOCOS oxide layer 22. The source region 25 and the drain region 26 are formed in self-alignment to the gate electrode 24, and the interlayer insulator 28 is formed thereon. One fin type storage electrode 29-1 is formed at an opening which is formed above the drain region 26. The dielectric layer 30 is formed on the surface of the fin type storage electrode 29-1, end the opposing electrode 31 is formed in contact with the dielectric layer 30.

When the fin type capacitor having this fin type storage electrode is used, it is possible to form a capacitance at the top and bottom surfaces of the fin type storage electrode, thereby making it possible to obtain a large storage capacitance with the limited area occupied by the cell.

FIG. 1(B) shows the construction of a fin type capacitor having two fin type storage electrodes, and FIG. 1(C) shows the construction of a fin type capacitor having three fin type storage electrodes. As shown in these figures, it is possible to increase the number of fin type storage electrodes to two (29-1, 29-2), three (29-1, 29-2, 29-3), . . . Hence, it is possible to obtain a sufficient storage capacitance even if the cell area becomes small due to the high integration density.

In FIGS. 1(A), (B) and(C), the illustration of the bit line is omitted.

FIG. 2 shows a plan view of a DRAM having the conventional fin type capacitor.

In FIG. 2, there are shown word lines 44 and 47, a first opening 49, a bit line 50, a second opening 55, and a second polysilicon layer 56.

The cell structure of this DRAM will be described in conjunction with the production method with reference to FIGS.3 and 4, but the bit line 50 extends in a horizontal direction and the word lines 44 and 47 extend in a vertical direction. A rectangular region indicated by a dotted line shows one cell of the DRAM. Lines X–X', Y–Y' and Z–Z' in FIG. 2 shows parts where the cross sections are taken in the cross sectional views which will be described later.

FIG. 3(A) through FIG. 3(E) and FIG. 4(A) through FIG. 4(C) are diagrams for explaining the processes of producing the DRAM having the conventional fin type capacitor.

In these figures, there are shown a semiconductor substrate 41, a LOCOS oxide layer 42, a gate oxide layer 43, a gate electrode 44, a source region 45, a drain region 46, a word line 47 of another cell, an interlayer insulator 48, a first, opening 49, a bit line 50, a $Si_3N_4$ layer 51, a first $SiO_2$ layer 52, a first polysilicon layer 53, a second $SiO_2$ layer 54, a second opening 55, a second polysilicon layer 56, a dielectric layer 57, and an opposing electrode 58.

A description will be given of the conventional method of producing the fin type capacitor having two fins, with reference to these explanatory diagrams. These explanatory diagrams show the cross section along the line X–X' in FIG. 2 which shows the plan view of a part of the DRAM.

First Process (Refer to FIG. 3(A)):

The surface of the p-type semiconductor substrate 41 is thermally oxidized to form the LOCOS oxide layer 42 which sections the element region. The gate oxide layer 43 is formed on this element region by a thermal oxidation, and a polysilicon layer is formed thereon by a CVD. The polysilicon layer is patterned to form the gate electrode 44 which also becomes the word line, and the source region 45 and the drain region 46 are formed in self-alignment to the gate electrode 44. In addition, the word line 47 of the other cell is formed on the LOCOS oxide layer 42 at the same time as the gate electrode 44.

Second Process (Refer to FIG. 3(B)):

The interlayer insulator 48 which is made up of $SiO_2$ is deposited by CVD to cover the entire surface, and the first opening 49 is provided at the contact part of the bit line.

Third Process (Refer to FIG. 3(C)):

A stacked layer of polysilicon layer and tungsten silicide (WSi) is deposited by CVD on the entire surface including the first opening 49. This stacked layer is patterned to form the bit line 50 which is connected to the source region 45 within the first opening 49.

Fourth Process (Refer to FIG. 3(D)):

The $Si_3N_4$ layer 51, the first $SiO_2$ layer 52, the first polysilicon layer 53, and the second $SiO_2$ layer 54 are successively deposited thereon by CVD.

Fifth Process (Refer to FIG. 3(E)):

The second $SiO_2$ layer 54, the first polysilicon layer 53, the first $SiO_2$ layer 52, the $Si_3N_4$ layer 51, the interlayer insulator 48, and the gate oxide layer 43 on the drain region 46 are etched using the same resist mask, so as to form the second opening 55 at the storage electrode contact part.

Sixth Process (Refer to FIG. 4(A)):

The second polysilicon layer 56 is formed by CVD on the entire surface including the second opening 55. Then, the second polysilicon layer 53, the second $SiO_2$ layer 54 and the first polysilicon layer 53 are successively etched to pattern the same to a predetermined shape.

Seventh Process (Refer to FIG. 4(B)):

The second $SiO_2$ layer 54 and the first $SiO_2$ layer 52 are etched by an isotropic wet etching using a HF solution, so as to form fin type storage electrodes made up of the first and second polysilicon layers 53 and 56. The $Si_3N_4$ layer 51 acts as a stopper with respect to the etching using HF (hydrofluoric acid).

Eighth Process (Refer to FIG. 4(C)):

The dielectric layer 57 is formed on the surfaces of the fin type storage electrodes which are made up of the first and second polysilicon layers 53 and 56, and a polysilicon layer is deposited by CVD to form the opposing electrode 58 and complete the fin type capacitor cell.

Thereafter, a BPSG layer is formed by a normal process, and the necessary aluminum wiring is made thereon.

However, according to the conventional method described above, the following problems are generated.

1. A short-circuit may occur between the conductor layers.

FIG. 5 is a diagram for explaining the process of patterning the storage electrode by the conventional method. FIG. 5 shows the cross section along the line Z–Z' in FIG. 2. In FIG. 5, there are shown the semiconductor substrate 41, the LOCOS oxide layer 42, the interlayer insulator 48, the bit line 50, the $Si_3N_4$ layer 51, the first $SiO_2$ layer 52, the first polysilicon layer 53, the second $SiO_2$ layer 54, and the second polysilicon layer 56.

FIG. 5(A) shows a stage where the LOCOS oxide layer 42 is formed on the semiconductor layer 41, the interlayer insulator 48 is formed, the bit line 50 is formed, and the $Si_3N_4$ layer 51, the first $SiO_2$ layer 52, the first polysilicon layer 53, the second $SiO_2$ layer 54 and the second polysilicon layer 56 are formed thereon.

FIG. 5(B) shows a state where the uppermost second polysilicon layer 56 is removed. Since this figure is the cross section along the line Z–Z' in FIG. 2, the second polysilicon layer 56 is to be eliminated completely. However, since the second polysilicon layer 56 includes a stepped part, the second polysilicon layer 56 partially remains on the sidewall portion of the stepped part.

FIG. 5(C) shows a state where the first polysilicon layer 53 is removed. In this case, since the first polysilicon layer 53 includes a stepped part, the first polysilicon layer 53 partially remains at the sidewall portion of the stepped part.

If the second polysilicon layer 56 or the first polysilicon layer 53 remains, there is a possibility of the adjacent storage electrodes becoming short-circuited by the etching residue of the polysilicon which is lifted off when the $SiO_2$ layers 52 and 54 and the like are removed at the subsequent processes.

In order to eliminate the above described etching residue, the etching time is normally made longer when etching the polysilicon by RIE, so as to make the so-called over-etching. However, if the over-etching is excessively made, too much of the flat portion becomes etched and the underlayer will be damaged. On the other hand, the etching is normally made using a resist mask which is patterned, and there is also a problem in that the resist will not be usable as a mask if the resist is damaged by the over-etching. Furthermore, the so-called etching shift in which the line width becomes narrow will occur when the over-etching is made, and there is still another problem in that the obtained pattern becomes smaller than the desired pattern.

On the other hand, the etching time naturally increases when the over-etching is made, and the production cost of the semiconductor device is increase thereby. In addition, when forming the fin type capacitor having a plurality of fins, it is necessary to alternately make the selective etching of the conductor layer and the insulator layer, and the total etching time is considerably increased when the over-etching is made because the number of etching processes is quite large to start with.

2. The thickness of the photoresist layer will become non-uniform.

FIG. 6(A) and FIG. 6(B) is a diagram for explaining the conventional photolithography process for forming a contact hole. In this figure, there are shown the semiconductor substrate 41, the LOCOS oxide layer 42, the gate oxide layer 43, the gate electrode 44, the source region 45, the drain region 46, the word line 47 of the other cell, the interlayer insulator 48, the first opening 49, the $Si_3N_4$ layer 51, the first $SiO_2$ layer 52, the first polysilicon layer 53, the second $SiO_2$ layer 54, a photoresist layer 59, and a photomask 60.

FIG. 6(A) shows the cross section along the line X–X' in FIG. 2. The LOCOS oxide layer 42 is formed on the semiconductor substrate 41, the gate oxide layer 43 is formed, and the gate electrode 44 and the word line 47 of the other cell are formed. Then, the interlayer insulator 48 is formed, and the bit line 50 is formed. The $Si_3N_4$ layer 51, the first $SiO_2$ layer 52, the first polysilicon layer 53, the second $SiO_2$ layer 54, and the second polysilicon layer 56 are formed thereon. The photoresist layer 59 is formed on top, and an exposure is made using the photomask 60.

FIG. 6(B) shows the cross section along the line Y–Y' in FIG. 2. The LOCOS oxide layer 42 is formed on the semiconductor layer 41, the gate oxide layer 43 and the interlayer insulator 48 are formed, and the bit line 50 is formed. Then, the $Si_3N_4$ layer 51, the first $SiO_2$ layer 52, the first polysilicon layer 53, and the second $SiO_2$ layer 54 are formed thereon. The photoresist layer 59 is formed on top, and an exposure is made using the photomask 60.

Hence, according to the conventional process of producing the fin type storage electrode, the second $SiO_2$ layer 54, the first polysilicon layer 53, the first $SiO_2$ layer 52, the $Si_3N_4$ layer 51, the interlayer insulator 48 and the gate oxide layer 43 are etched by the photolithography technique to form the opening which is used to form the fin type storage electrode. But since a stepped part exists on the surface of the uppermost second $SiO_2$ layer 54 when forming this opening, the thickness of the photoresist layer 59 which is spin-coated on the uppermost second $SiO_2$ layer 54 becomes extremely non-uniform. As a result, it is difficult to accurately form a fine contact opening, and there is a problem in that the production yield is deteriorated thereby.

3. A disconnection easily occurs at the contact hole.

In FIG. 4(B), when forming the fin type storage electrodes made up of the first and second polysilicon layers 53 and 56, the isotropic etching using the HF solution is made to remove the $SiO_2$ layers 54 and 52. When making this isotropic etching, the $Si_3N_4$ layer 51 which isolates the bit line 50 acts as a stopper (mask) with respect to the HF solution, and the etching of the bit line 50 will not occur even if submerged in the HF solution. However, the existence of the $Si_3N_4$ layer 51 introduces a problem shown in FIG. 7.

FIG. 7 shows a cross section of a peripheral circuit part of the conventional memory described in conjunction with FIGS. 3 and 4. In FIG. 7, those parts which are the same as those corresponding parts in FIGS.3 and 4 are designated by the same reference numerals, and a description thereof will be omitted. In FIG. 7, there are shown an impurity diffusion layer 37, a BPSG layer 38, and an Al layer 39.

When a contact hole shown in FIG. 7(A) is formed and the Al layer 39 is formed thereafter, it is necessary to stabilize the contact resistance between the impurity diffusion layer 37 and the Al layer 39. Normally, a pre-process is made using a solution of the HF system before forming the Al layer 39, so as to remove the natural oxide layer on the impurity diffusion layer 37.

However, if such a pre-process is made, the BPSG layer 38 and the $SiO_2$ layer 48 will recede by being etched by the HF solution, but the $Si_3N_4$ will not be etched. As a result, only the $Si_3N_4$ layer 51 projects within the contact hole as shown in FIG. 7(B).

When the Al layer 39 is formed by sputtering over a contact hole having such a shape, there is a problem in that a disconnection of the Al layer 39 easily occurs at a part A as shown in FIG. 7(C).

SUMMARY OF THE INVENTION

Accordingly, it is a general object of the present invention to provide a novel and useful semiconductor device and method of producing the same, in which the problems described above are eliminated.

Another and more specific object of the present invention is to provide a semiconductor device comprising a substrate having a top surface, and a fin type capacitor having a first electrode including a first part which extends upwards from the substrate and a second part which extends approximately parallel to the top surface of the substrate from the first part, where the second part is made up of at least one conductor layer.

Still another object of the present invention is to provide a method of producing a semiconductor device comprising the steps of forming above a substrate surface a first insulator layer which has a surface approximately parallel to the substrate surface, alternately forming a first conductor layer and a second insulator layer at least once, forming a contact hole which reaches the substrate by penetrating each second insulator layer, each first conductor layer and the first insulator, forming a second conductor layer on an uppermost second insulator layer and on a surface of the contact hole, and patterning the second and first conductor layers to a predetermined shape. According to the present invention, there is no possibility of a conductor layer remaining at the stepped part when patterning the conductor layer and short-circuiting the adjacent storage electrodes. In addition, since the underlayer of the photoresist layer is flat, the photoresist layer can be coated uniformly, thereby stabilizing the photolithography process and realizing a high production yield. Further, by forming the uppermost fin of the storage electrode so as not to have undulations, the process of forming the contact hole is facilitated. In addition, it becomes possible to completely etch the conductor layer at the time of the patterning, thereby preventing the short-circuit of the adjacent storage electrodes. In addition, by employing a structure which includes no nitride layer at the contact hole part, it is possible to prevent a disconnection of the second conductor layer within the contact hole. Accordingly, it is possible to stably produce a fine fin type capacitor cell with improved reliability and yield.

A further object of the present invention is to provide a method of producing a semiconductor device comprising the steps of (a) forming a first insulator layer above a substrate surface, (b) alternately forming a first conductor layer and a second insulator layer at least once, (c) forming a contact hole which reaches the substrate by penetrating each second insulator layer and each first conductor layer, (d) forming a second conductor layer on an uppermost second insulator layer and on a surface of the contact hole, and (e) patterning the second and first conductor layers, where at least one of the steps (c) and (e) continuously etches at least the second insulator layer and the first insulator layer under a condition such that each layer is etched at approximately the same etching speed. According to the present invention, it is possible to greatly reduce the number of production processes.

Other objects and further features of the present invention will be apparent from the following detailed description when read in conjunction with the accompanying drawings.

BRIEF DESCRIPTION OF THE WINGS

FIG. 1 in parts (A) through (C) is a cross sectional view for explaining the construction of a conventional fin type capacitor;

FIG. 2 is a plan view showing an essential part of a DRAM having the conventional fin type capacitor;

FIG. 3 in parts (A) through (E) and FIG. 4 in parts (A) through (C) are cross sectional views for explaining the process of producing the DRAM having the conventional fin type capacitor;

FIG. 5 in parts (A) through (C) is a cross sectional view for explaining a patterning process of a storage electrode according to a conventional method;

FIG. 6 in parts (A) and (B) is a cross sectional view for explaining a photolithography process of a contact hole according to a conventional method;

FIG. 7 in parts (A) through (C) is a cross sectional view for explaining a disconnection of an Al layer according to a conventional method;

FIG. 8 in parts (A) and (B) is a cross sectional view for explaining the operating principle of a first embodiment of a method of producing a semiconductor device according to the present invention;

FIG. 9 in parts (A) through (E) and FIG. 10 in parts (A) through (C) are cross sectional views for explaining production processes of first and second embodiments of the method of producing the semiconductor device according to the present invention;

FIG. 11 in parts (A) through (E) is a cross sectional view for explaining production processes of third and fourth embodiments of the method of producing the semiconductor device according of the present invention;

FIG. 12 in parts (A) through (E) and FIG. 13 in parts (A) through (C) are cross sectional views for explaining production processes of a fifth embodiment of the method of producing the semiconductor device according to the present invention;

Figure 16:
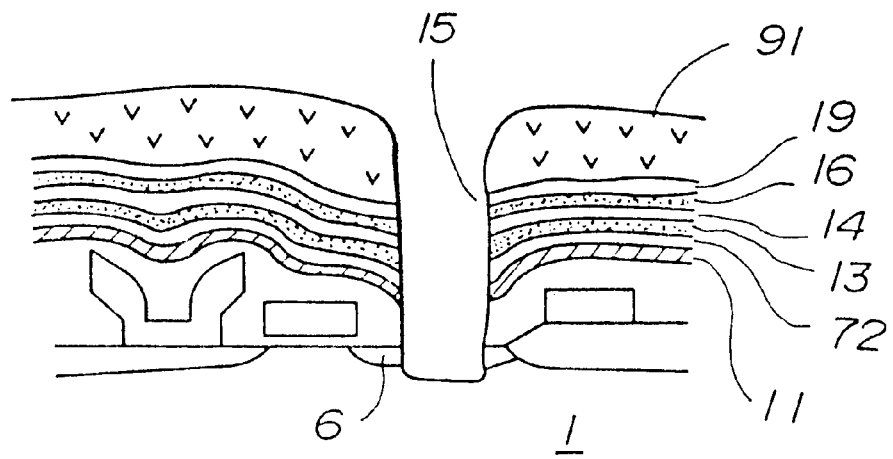
Figure 17:
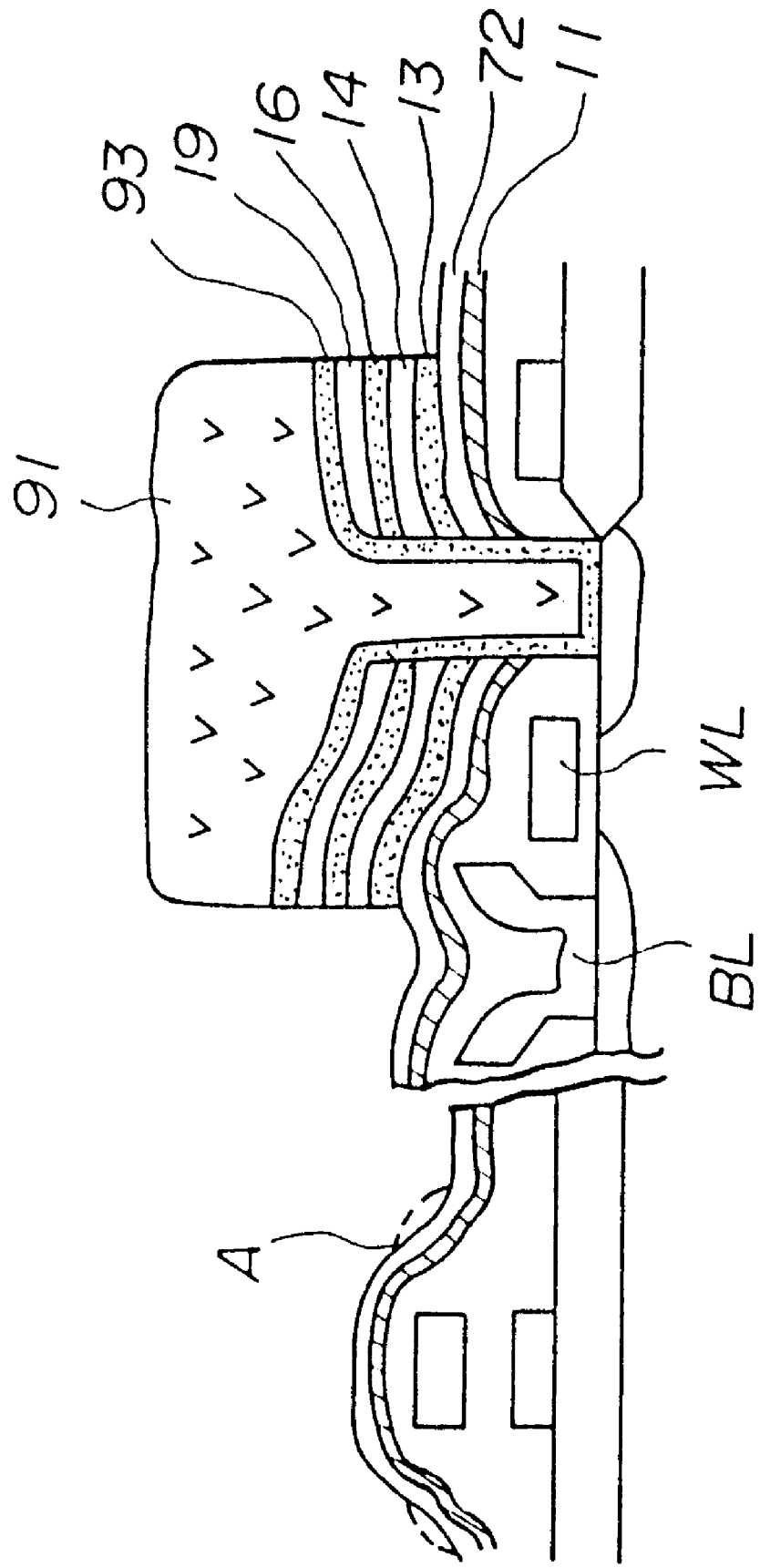
Figure 18:
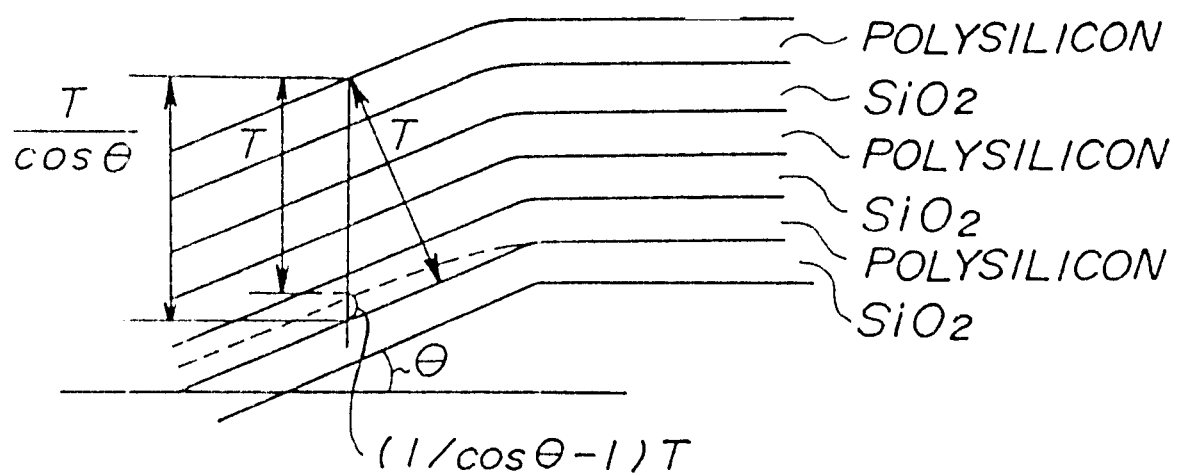

FIG. 16. is a cross sectional view for explaining a problem which occurs when forming a contact hole;

FIG. 17 is a cross sectional view for explaining the formation of a fin structure;

FIG. 18 is a diagram for explaining a residual layer on a stepped part; and

Figure 19:
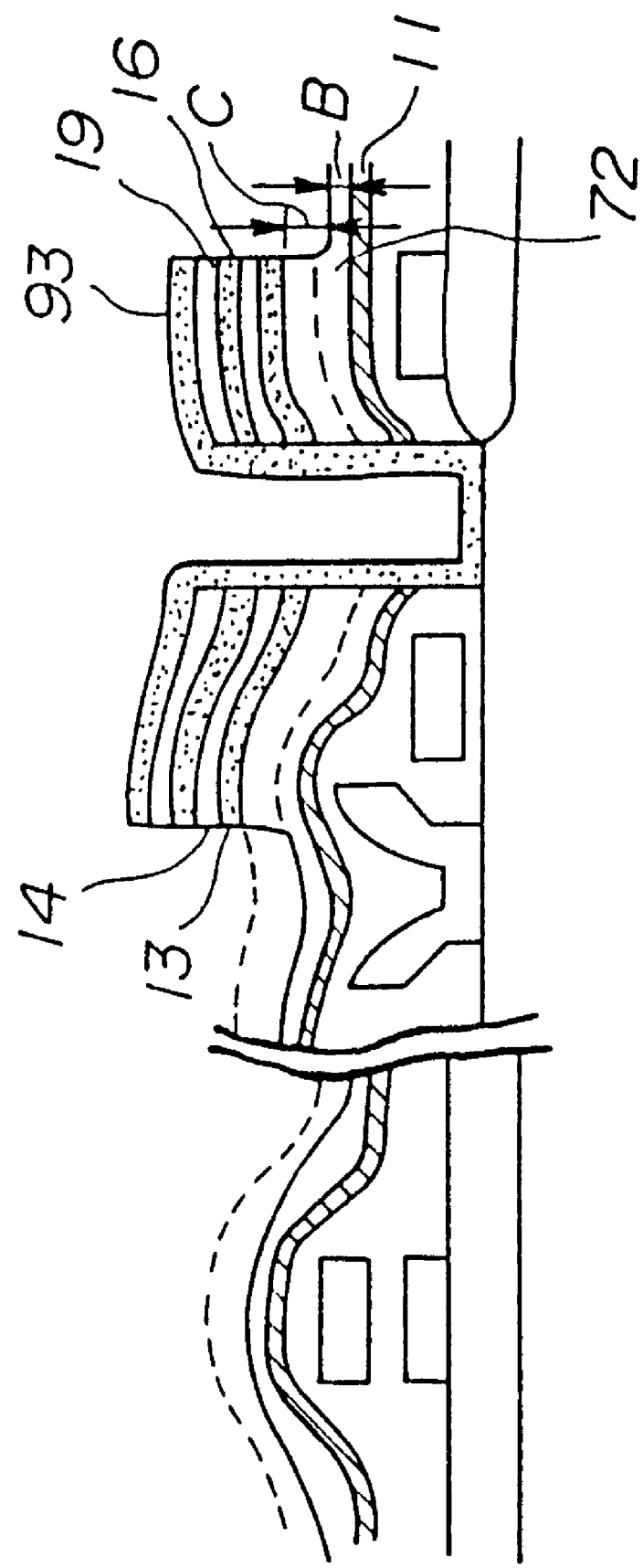

FIG. 19 is a cross sectional view for explaining an eight embodiment of the method of producing the semiconductor device according to the present invention.

DESCRIPTION OF THE PREFERRED EMBODIMENTS

First, a description will be given of the operating principle of a first embodiment of a method of producing a semiconductor device according to the present invention, by referring to FIG. 8.

This embodiment includes a step of forming a first insulator layer on a substrate, a step of forming a contact opening which penetrates the first insulator layer and reaches the substrate, a step of forming a first conductor layer on the first insulator layer and including the opening, a step of patterning the first conductor layer to a predetermined shape, and a step of removing at least a part of the first insulator layer under the first conductor layer, and forms the first insulator layer by coating SOG. It is possible to form a semiconductor device having storage electrodes with two or more fins, by alternately forming one or more conductor layers and one or more insulator layers after the step of forming the first insulator layer on the substrate.

Figure 8A:
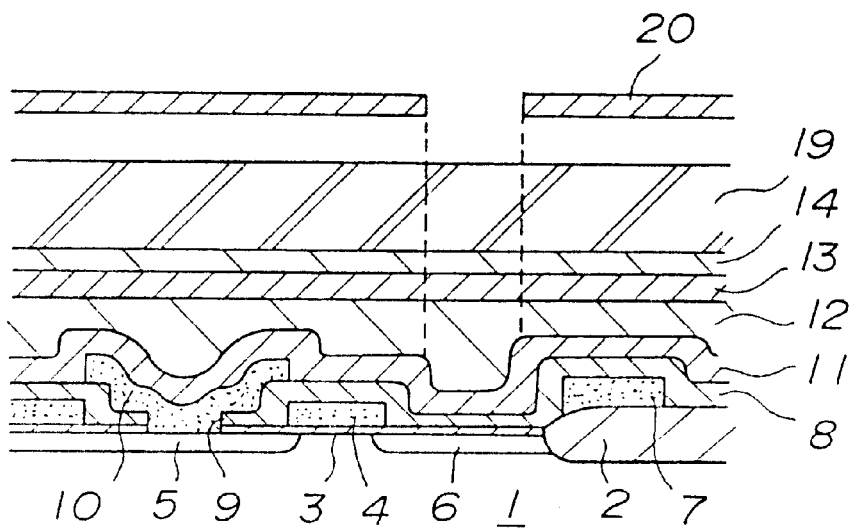

FIGS. 8(A) and (B) is a diagram for explaining the operating principle of this embodiment.

In FIG. 8, there are shown a semiconductor substrate 1, a LOCOS oxide layer 2, a gate oxide layer 3, a gate electrode 4, a source region 5, a drain region 6, a word line 7, an interlayer insulator 8, a first opening 9, a bit line 10, a $Si_3N_4$ layer 11, a SOG layer 12, a first polysilicon layer 13, a second $SiO_2$ layer 14, a resist layer 19, and a photomask 20.

Figure 1A:
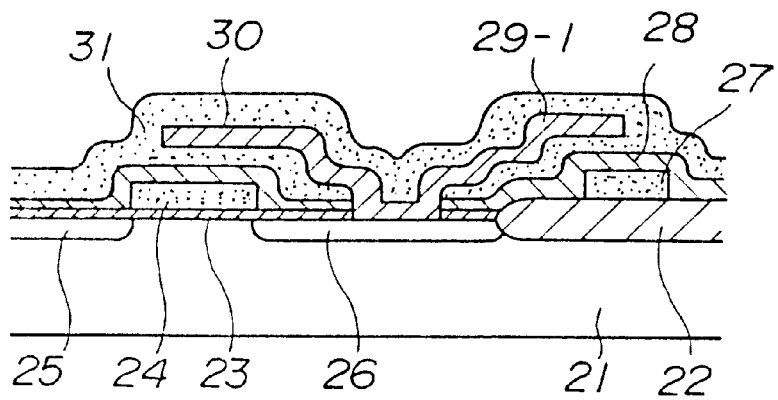
Figure 1B:
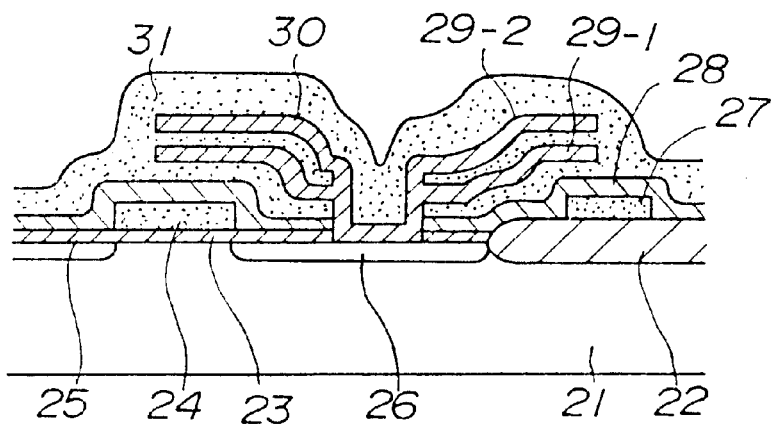
Figure 1C:
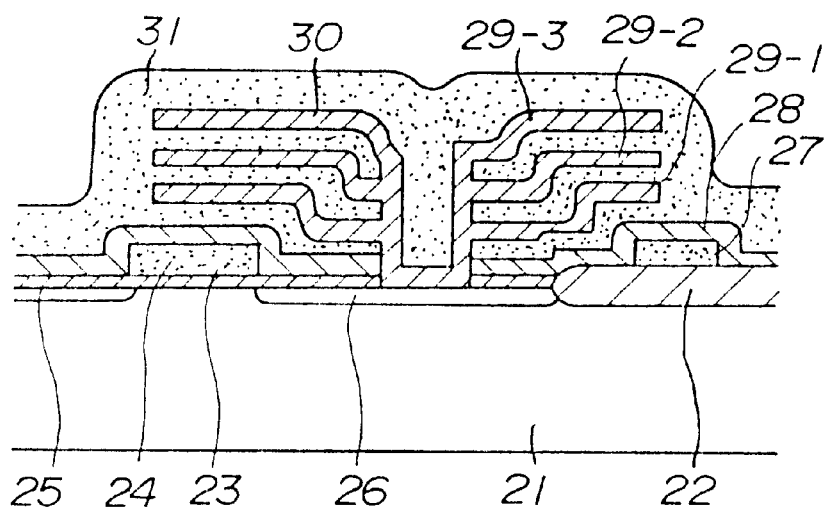
Figure 2:
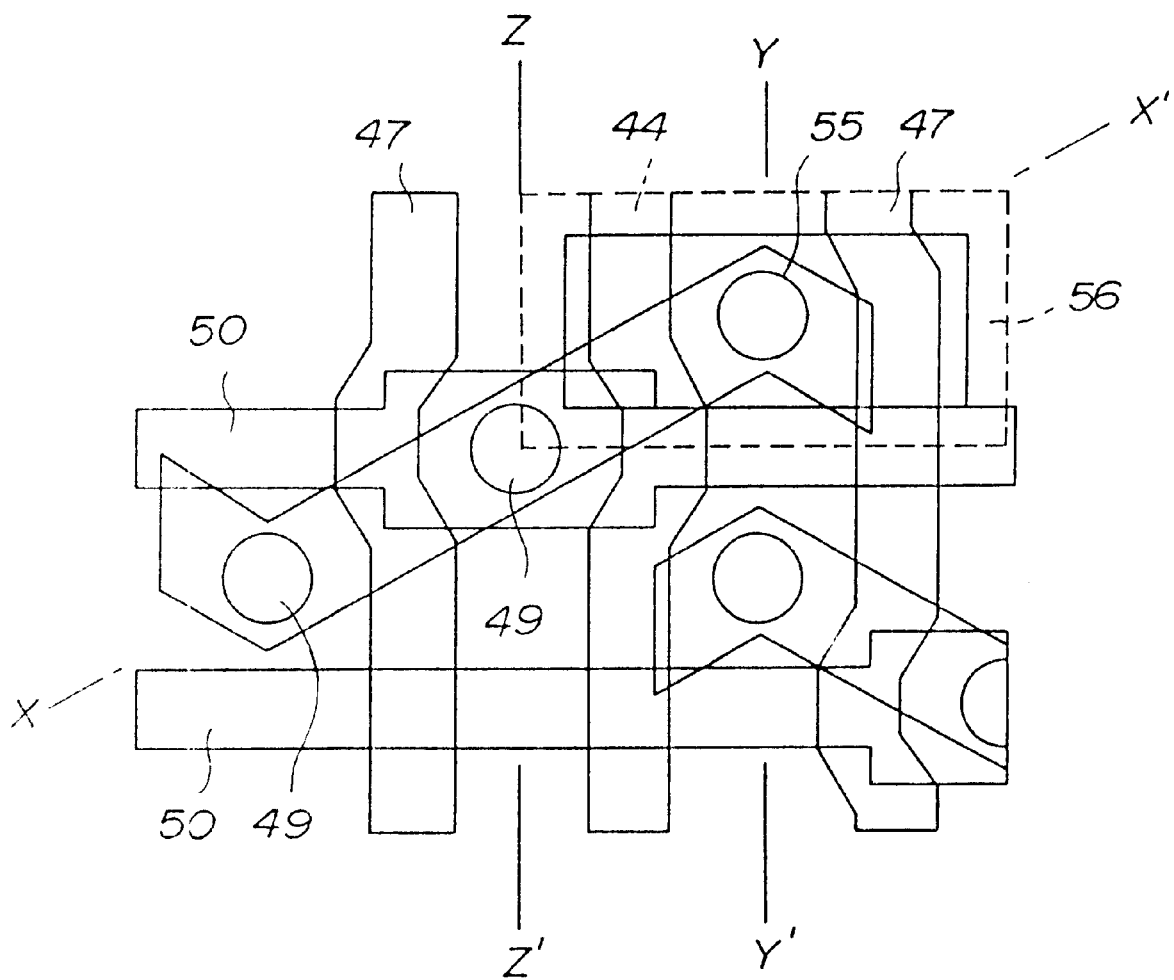
Figure 8B:
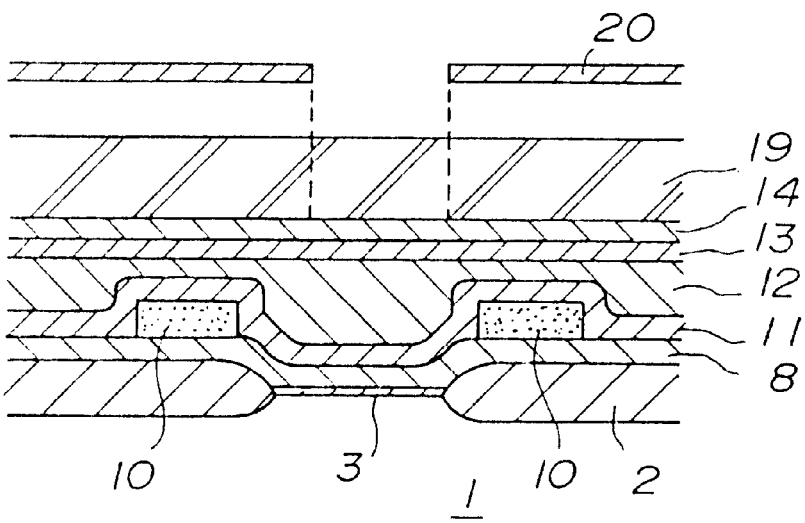

FIG. 8(A) shows a cross section along the line X–X' in FIG. 2, and FIG. 8(B) shows the cross section along the line Y–Y' in FIG. 2. Although FIG. 2 shows the plan view of the part of the conventional DRAM, the plan view of this embodiment is the same as that shown in FIG. 2.

In this embodiment, the LOCOS oxide layer 2 which sections an element forming region is formed on the surface of the p-type semiconductor substrate 1, and the gate oxide layer 3 is formed on this element forming region.

Then, the gate electrode 4 made of polysilicon and the word line 7 of the other cell are formed on top. The n-type source region 5 and the drain region 6 are formed in self-alignment to the gate electrode 4.

Next, the interlayer insulator 8 is formed on top, and the bit line 10 is formed on the source region 5 which is exposed within the first opening 9 which is provided at the contact part of the bit line.

The $Si_3N_4$ layer 11 is formed on top, and the SOG layer 12 is formed thereon by spin-coating. In addition, the first polysilicon layer 13, and the second $SiO_2$ layer 14 are successively deposited thereon.

The photoresist layer 19 is formed on top, and this photoresist layer 19 is exposed via a window in the photomask 20. Thereafter, the photoresist layer 19 is developed, and the exposed region of the photoresist layer 19 is removed.

According to these processes, the SOG layer 12 is formed on the surface of the $Si_3N_4$ layer 11 which has large undulations so as to planarize the top surface. As a result, the surfaces of the first polysilicon layer 13 and the second $SiO_2$ layer 14 which are thereafter successively deposited or the SOG layer 12 are also planarized.

For this reason, the photoresist layer 19 is uniformly coated, and the photolithography process is stabilized. In addition, when patterning the storage electrodes, there is no possibility of short-circuiting the adjacent storage electrodes by the etching residue of the first polysilicon layer 13 or the second polysilicon layer. Therefore, it is possible to realize a high production yield.

It is possible to form the second oxide layer 14 or an oxide layer which is formed above the second oxide layer 14 by the SOG. In such cases, effects similar to those described above may be obtained because the surface of the polysilicon layer which is formed after the SOG oxide layer is planarized.

SOG was conventionally used as a planarizing material in the production processes of semiconductor devices. However, the insulation resistance or the like of the SOG was insufficient, and a stable process could not be realized. In addition, there was a possibility of introducing a problem in the characteristic of the semiconductor devices after production thereof.

However, in this embodiment, although the SOG is used as the planarizing material, the SOG is removed by the HF at a subsequent stage when forming the fins. For this reason, such problems will not occur in this embodiment.

This embodiment has particularly notable effects when applied to the method of producing the fin type storage electrodes of the capacitor of the DRAM, however, it is of course possible to apply this embodiment to the production of other semiconductor devices.

Next, a more detailed description will be given of this embodiment, by referring to FIGS. 9 and 10.

FIGS. 9(A) through (E) and FIGS. 10(A) through (C) are diagrams for explaining the production processes of the first embodiment, and in this embodiment, the present invention is applied to the method of producing the DRAM having the fin type capacitor.

In FIGS. 9 and 10, there are shown the semiconductor substrate 1, the LOCOS oxide layer 2, the gate oxide layer 3, the gate electrode 4, the source region 5, the drain region 6, the word line 7, the interlayer insulator 8, the first opening 9, the bit line 10, the $Si_3N_4$ layer 11, the SOG layer 12, the first polysilicon layer 13, the second $SiO_2$ layer 14, a second opening 15, a second polysilicon layer 16, a dielectric layer 17, an opposing electrode 18.

The first embodiment of the method of producing the DRAM having the fin type capacitor will be described by referring to these explanatory diagrams of the production processes.

These explanatory diagrams of the production processes show the cross section along the line X–X' in FIG. 2 which shows the plan view of the part of the DRAM. Although FIG. 2 shows the plan view of the part of the conventional DRAM, the plan view in this embodiment is the same as that shown in FIG. 2.

Figure 9A:
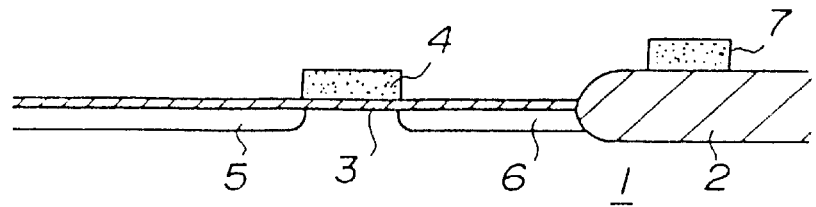

First Process (Refer to FIG. 9(A)):

The surface of the semiconductor substrate 1 which is made of p-type silicon is thermally oxidized to form the LOCOS oxide layer 2 which has a thickness of 3000 Å and sections the element forming region. The gate oxide layer 3 having a thickness of 100 Å is formed on the element forming region by thermal oxidation, and a polysilicon layer having a thickness of 1500 Å is formed thereon by CVD. The polysilicon layer is patterned to form the gate electrode 4 which also becomes the word line. The n-type source region 5 and the drain region 6 are formed in self-alignment to the gate electrode 4. In addition, the word line 7 of the other cell is formed on the LOCOS oxide layer 2 at the same time as the gate electrode.

Figure 9B:
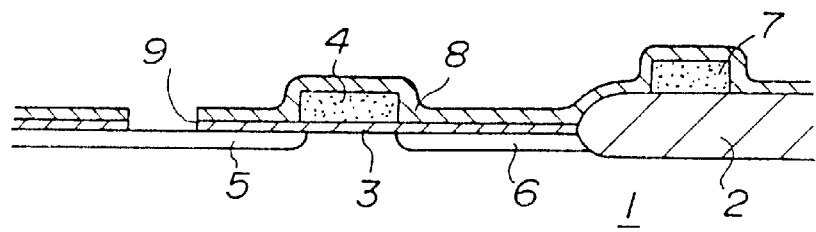

Second Process (Refer to FIG. 9(B)):

The interlayer insulator 8 which is made of $SiO_2$ is deposited by CVD to a thickness of 1000 Å, and the first opening 9 is provided at the contact part of the bit line.

Figure 9C:
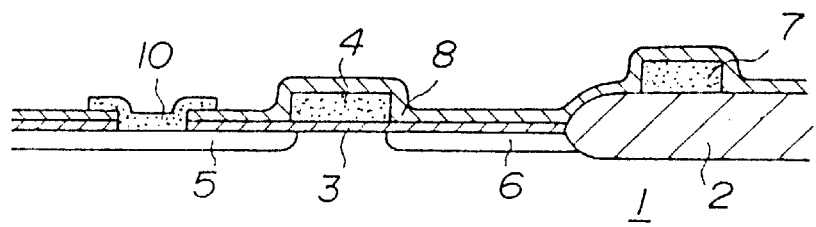

Third Process (Refer to FIG. 9(C)):

A polysilicon layer having a thickness of 500 Å and a tungsten silicide (WSi) having a thickness of 1000 Å are deposited by CVD on the entire surface including the first opening 9. The WSi layer and the polysilicon layer are patterned to form the bit line 10 which connects to the source region 5 which is exposed within the first opening 9.

Figure 6A:
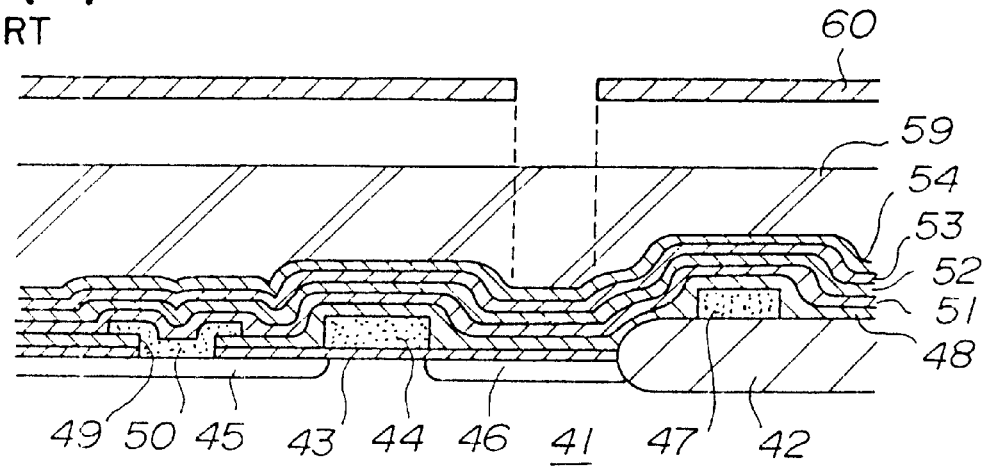
Figure 6B:
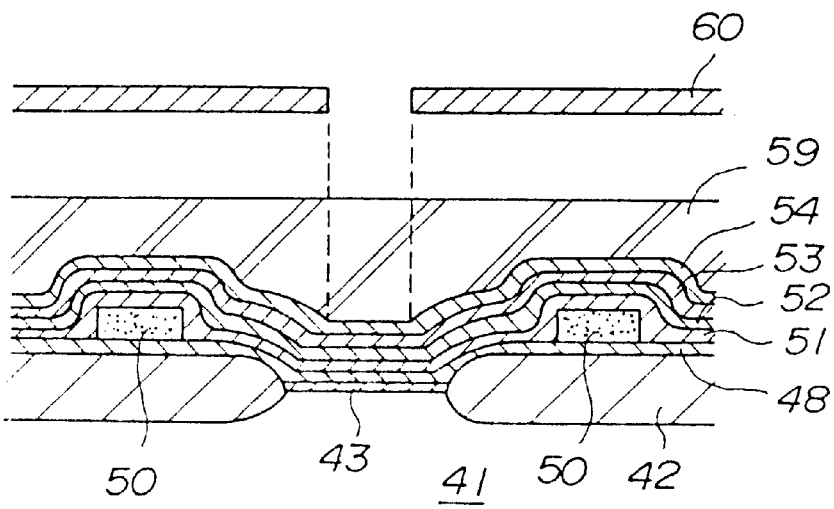
Figure 9D:
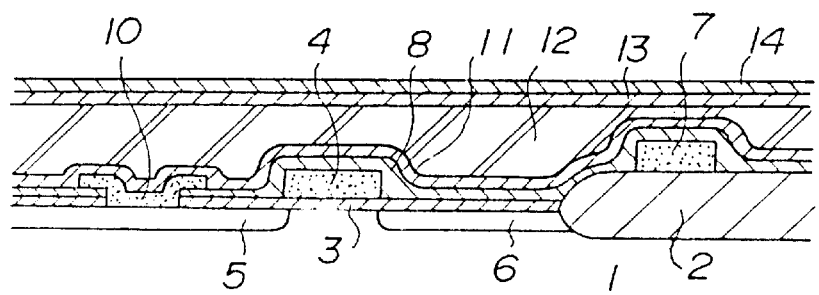

Fourth Process (Refer to FIG. 9(D)):

Next, the $Si_3N_4$ layer 11 having a thickness of 500 Å is formed on top by CVD. Then, an insulator is spin-coated on the $Si_3N_4$ layer 11, so as to form the SOG (Spin-On-Glass) layer 12 which has a thickness of 500 Å at a part corresponding to the first $SiO_2$ layer (52 of FIG. 6(D)) of the prior art, so as to planarize the surface.

The surface of the SOG layer 12 becomes approximately planar because the SOG layer 12 is spin-coated to a sufficient thickness such that the conductor layer underneath is completely covered thereby. By heating the SOG layer 12 and thermally solidifying the same in the generally known manner, the SOG insulator layer having the planar (flat) surface is formed. This SOG insulator layer 12 is etched back by a plasma etching, for example, until it becomes a predetermined thickness.

Further, the first polysilicon layer 13 having a thickness of 500 Å and the second $SiO_2$ layer 14 having a thickness of 500 Å are successively deposited on the SOG layer 12 by CVD.

Figure 9E:
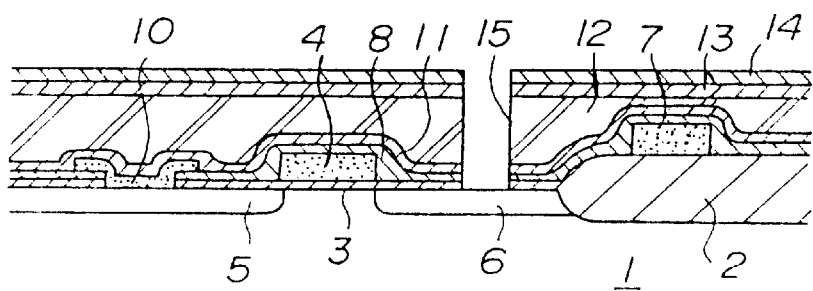

Fifth Process (Refer to FIG. 9(E)):

The second $SiO_2$ layer 14, the first polysilicon layer 13, the SOG layer 12, the $Si_3N_4$ layer 11, the interlayer insulator 8 and the gale oxide layer 3 on the drain region 6 are etched using the same resist mask, so as to form the second opening 15 for the contact part of the storage electrode.

Figure 10A:
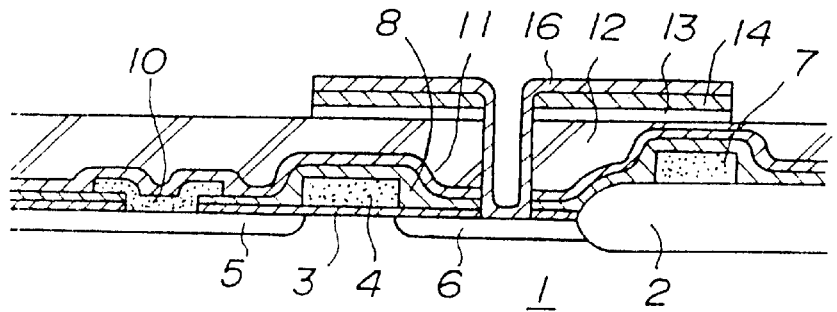

Sixth Process (Refer to FIG. 10(A)):

The second polysilicon layer 16 having a thickness of 500 Å is formed by CVD on the entire surface including the second opening 15, and the second polysilicon layer 16, the second $SiO_2$ layer 14 and the first polysilicon layer 13 are successively etched to pattern the same to a predetermined shape.

Figure 10B:
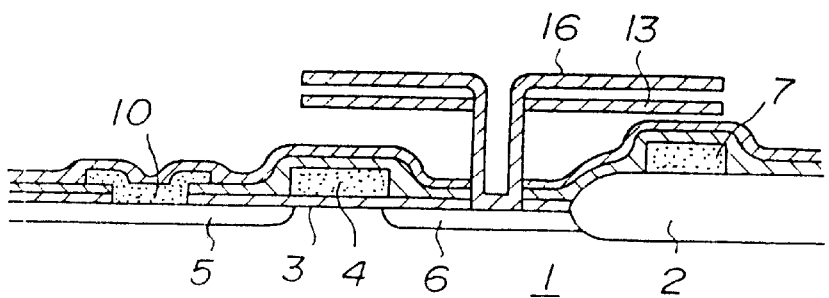

Seventh Process (Refer to FIG. 10(B)):

The second $SiO_2$ layer 14 and the SOG layer 12 are etched by an isotropic wet etching using a solution which includes approximately 1% hydrofluoric acid (HF), so as to form the fin type storage electrodes which are made up of the first polysilicon layer 13 and the second polysilicon layer 16. The $Si_3N_4$ layer 11 in this case acts as a stopper with respect to the HF etching.

Figure 10C:
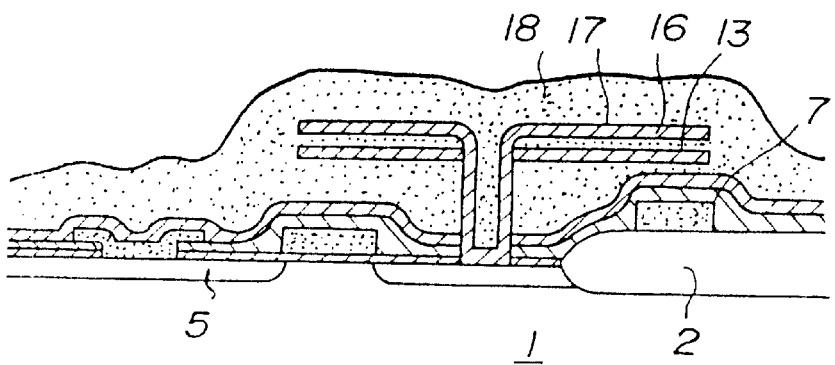

Eighth Process (Refer to FIG. 10(C)):

The dielectric layer 17, which is made up of a stacked layer of a $Si_3N_4$ layer having a thickness of 50 Å and a silicon oxide layer having a thickness of 10 Å, is formed on the surfaces of the fin type storage electrodes which are made up of the first polysilicon layer 13 and the second polysilicon layer 16. The $Si_3N_4$ is formed by CVD, and the silicon oxide layer is formed by thermal oxidation. Thereafter, a conductive polysilicon having a thickness of 1000 Å is formed by CVD to form the opposing electrode 18, and the fin type capacitor cell is thus completed.

In this embodiment, the number of fins is two. However, depending on the required electrostatic capacitance, it is possible to form three fins. In this case, the storage electrodes are formed by forming the second polysilicon layer 16 on the second $SiO_2$ layer 14 in the fourth process, further forming a third $SiO_2$ layer thereon and forming the second opening 15, and forming a third polysilicon layer on the entire surface including the second opening 15.

By repeating similar processes, it is of course possible to form storage electrodes having four or more fins.

Second Embodiment

Figure 3A:
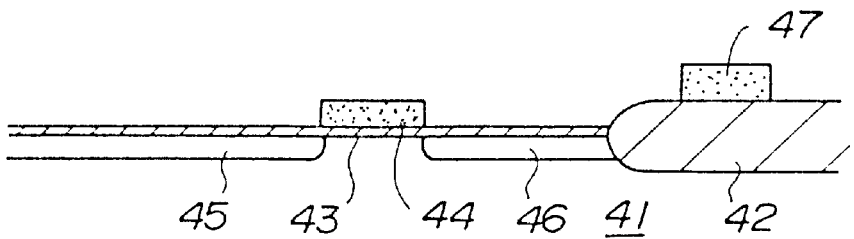
Figure 3B:
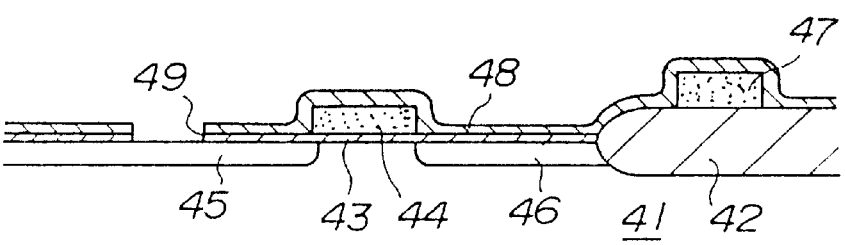
Figure 3C:
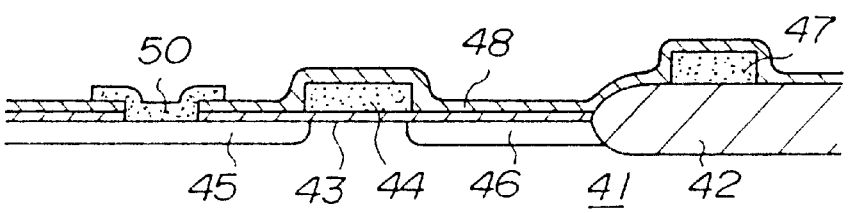
Figure 3D:
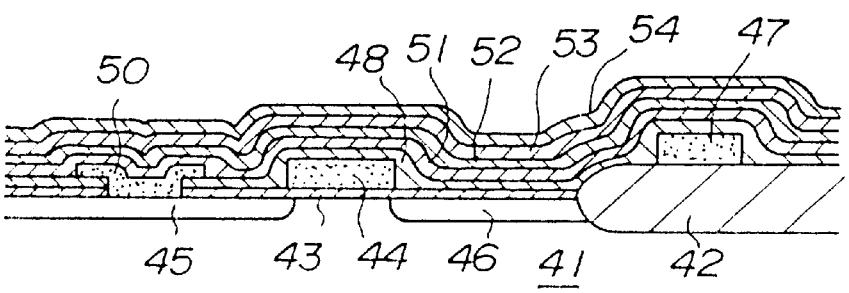
Figure 3E:
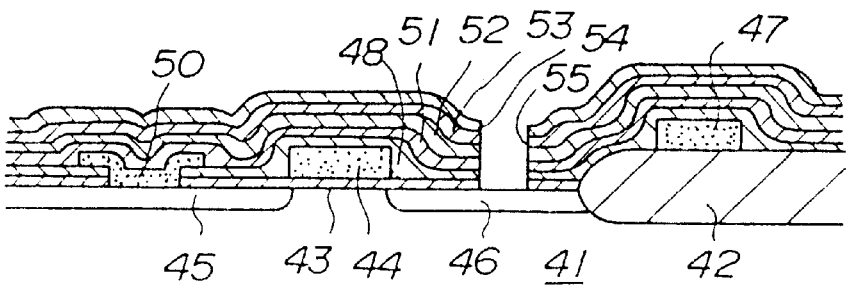

In the first embodiment described above, the part (52 of FIG. 3(D)) corresponding to the first $SiO_2$ layer of the prior art is made of the SOG. However, as a modification of the first embodiment, the part (54 of FIG. 3(D)) corresponding to the second $SiO_2$ layer of ear the prior art, that is, the second $SiO_2$ layer 14 of the first embodiment, may be formed by the SOG.

According to this embodiment, there is no possibility of short-circuiting the adjacent storage electrodes by the polysilicon layer which remains at the stepped part when patterning the polysilicon layer. In addition, because the underlayer of the photoresist layer is planarized, it is possible to uniformly coat the photoresist layer, thereby stabilizing the photolithography process and realizing a high production yield.

Next, a description will be given of a second embodiment of the method of producing the semiconductor device according to the present invention, by referring to FIGS. 9 and 10. In this embodiment, BPSG is used in place of SOG. In addition, since the first through third processes shown in FIGS. 9(A) through (C) are the same as those of the first embodiment, a, description thereof will be omitted.

Fourth Process (Refer to FIG. 9(D)):

A BPSG layer 12 having a thickness of 1500 Å is formed by CVD on the entire surface of the $Si_3N_4$ layer 11. Then, a thermal process is carried out at 900° C. for 10 minutes, so as to reflow the BPSG layer 12. As a result, the BPSG layer 12 which is obtained has a planar (flat) surface which is approximately parallel to the surface (top surface) of the substrate 1.

The surface of the BPSG layer 12 is planarized by the reflow process. However, since the BPSG layer 12 is formed sufficiently thick so as to planarize the stepped part, it is necessary to etch back the BPSG layer 12 to a predetermined thickness. For example, a plasma etching is made with respect to the entire surface of the BPSG layer 12 to make this etch back. The plasma etching of the BPSG layer 12 is stopped at a thickness which covers at least the conductor layer underneath, so as to adjust the BPSG layer 12 to the predetermined thickness.

In addition, the polysilicon layer 13 having a thickness of 500 Å and the $SiO_2$ layer 14 having a thickness of 500 Å are successively grown on the BPSG layer 12 by CVD.

The fifth process (Refer to FIG. 9(E)) through the eighth process (Refer to FIG. 10(C)) are the same as those of the first embodiment except that the BPSG layer 12 is used in place of the SOG layer, and a description thereof will be omitted.

Of course, it is possible to use PSG or BSG in place of the BPSG.

Next, a description will be given of a third embodiment of the method of producing the semiconductor device according to the present invention, by referring to FIG. 11. In FIG. 11, those parts which are the same as those corresponding parts in FIGS. 9 and 10 are designated by the same reference numerals, and a description thereof will be omitted. Further, the first through third processes are the same as those of the first embodiment shown in FIG. 9(A) through (C), and a description thereof will be omitted.

Figure 11A:
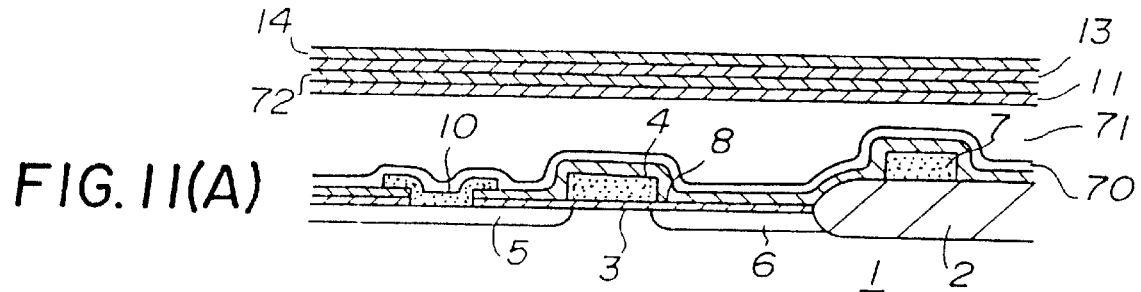

Fourth Process (Refer to FIG. 11(A)):

An oxide layer 70 having a thickness of 300 Å is formed on the entire surface of the interlayer insulator 8 by CVD. However, this oxide layer 70 may be omitted. Thereafter, a BPSG layer 71 having a thickness of 1500 Å is formed on the entire surface of the oxide layer 70, and a thermal process is carried out at 900° C. for 10 minutes to reflow the BPSG layer 71. As a result, it is possible to obtain the BPSG layer 71 which has a planar (flat) surface which is approximately parallel to the surface (top surface) of the substrate 1. In addition, the $Si_3N_4$ layer 11 and a $SiO_2$ layer 72 respectively having a thickness of 500 Å are successively grown on the BPSG layer 71 by CVD.

Figure 11B:
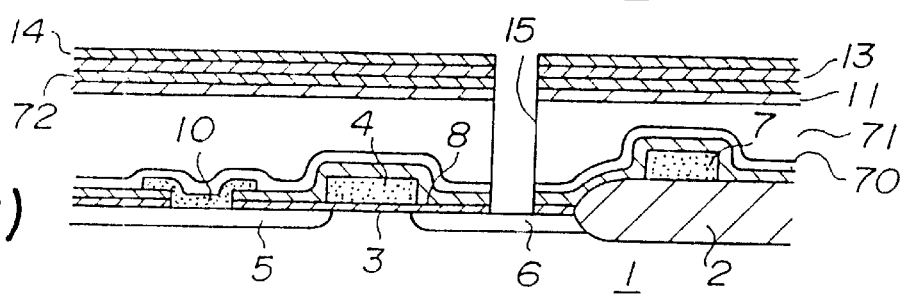

Fifth Process (Refer to FIG. 11(B)):

The $SiO_2$ layer 14, the polysilicon layer 13, the $SiO_2$ layer 72, the $Si_3N_4$ layer 11, the BPSG layer 71, the oxide layer 70, the interlayer insulator 8 and the gate oxide layer 3 on the drain region 6 are etched using the same resist mask, so as to form the opening 15 for the contact part of the storage electrode.

Figure 11C:
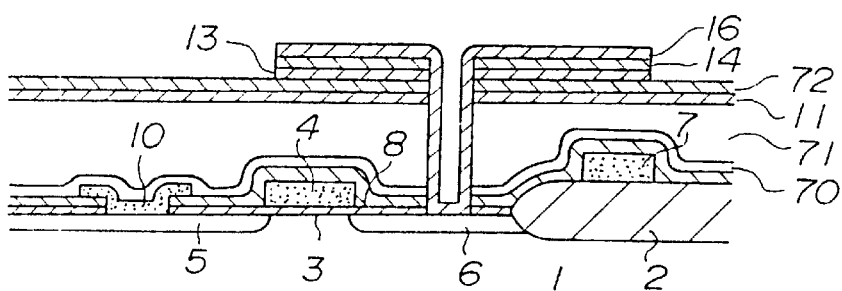

Sixth Process (Refer to FIG. 11(C)):

The polysilicon layer 16 having a thickness of 500 Å is formed by CVD on the entire surface including the opening 15. In addition, the polysilicon layer 16, the $SiO_2$ layer 14 and the polysilicon layer 13 are successively etched to pattern the same to a predetermined shape.

Figure 11D:
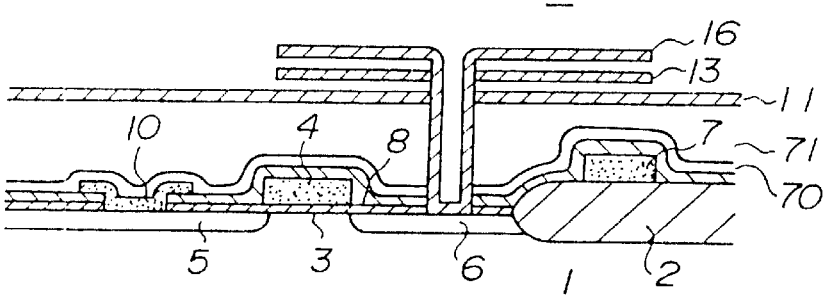

Seventh Process (Refer to FIG. 11(D)):

The $SiO_2$ layers 14 and 72 are removed by an isotropic wet etching using HF solution, so as to form the fin type storage electrodes which are made up of the polysilicon layers 16 and 13. The $Si_3N_4$ layer 11 acts as the stopper with respect to the HF etching.

Figure 11E:
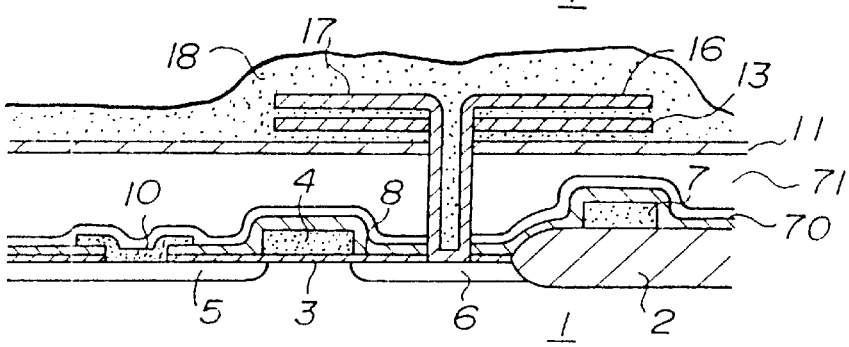

Eighth Process (Refer to FIG. 11(E)):

The dielectric layer 17, which is made up of a stacked layer of a $Si_3N_4$ layer having a thickness of 50 Å and a silicon oxide layer having a thickness of 10 Å, is formed on the surfaces of the fin type storage electrodes which are made up of the polysilicon layers 16 and 13. The $Si_3N_4$ layer is formed by CVD, and the silicon oxide layer is formed by thermal oxidation. Thereafter, a conductive polysilicon layer having a thickness of 1000 Å is deposited by CVD so as to form the opposing electrode 18, and the fin type capacitor cell is completed.

When increasing the number of fins so as to increase the capacitance of the capacitor, a polysilicon layer and a $SiO_2$ layer are successively grown after forming the $SiO_2$ layer 14 in the fourth process (FIG. 11(A)) a number of times depending on the desired number of fins.

Next, a description will be given of a fourth embodiment of the method of producing the semiconductor device according to the present invention, by referring to FIG. 11. In this embodiment, SOG is used in place of BPSG. In addition, since the first through third processes are the same as those of the first through third embodiments shown in FIG. 9(A) through (C), a description thereof will be omitted.

Fourth Process (Refer to FIG. 11(A)):

Similarly as in the case of the third embodiment, the oxide layer 70 having a thickness of 300 Å is formed on the entire surface of the interlayer insulator 8 by CVD. However, it is not essential that this oxide layer 70 is provided. Thereafter, the SOG layer 71 having a thickness of 500 Å is spin-coated on the entire surface of the oxide layer 70. In this case, no thermal process is necessary to carry out a reflow process as in the case where the BPSG is used.

The processes carried out thereafter are basically the same as those of the third embodiment, and a description thereof will be omitted.

In this embodiment, the SOG which used for the planarization is removed at the end, and no problem will occur although the characteristic of the SOG may be insufficient as an insulator.

Next, a description will be given of a fifth embodiment of the method of producing the semiconductor device according to the present invention, by referring to FIGS. 12 and 13. In FIGS. 12 and 13, those parts which are essentially the same as those corresponding parts in FIGS. 9 and 10 are designated by the same reference numerals. Further, FIGS. 12 and 13 respectively show the cross section along the line X–X' in FIG. 2 which shows the plan view of a part of the DRAM. Although FIG. 2 shows the plan view of the part of the conventional DRAM, the plan view in this embodiment is the same as that shown in FIG. 2.

In FIGS. 12 and 13, there are shown a p-type silicon substrate 1, a $SiO_2$ layer 2, a gate oxide ($SiO_2$) layer 3, n-type diffusion layers 5 and 6, gate electrodes 4 and 7, a $SiO_2$ layer 8, a conductor layer 10, a $SiO_2$ layer 80, a polyimide layer 81, a polysilicon layer 13, a polyimide layer 14, a polysilicon layer 16, a storage electrode 85, a dielectric layer 17, and an opposing electrode 18.

Figure 12A:
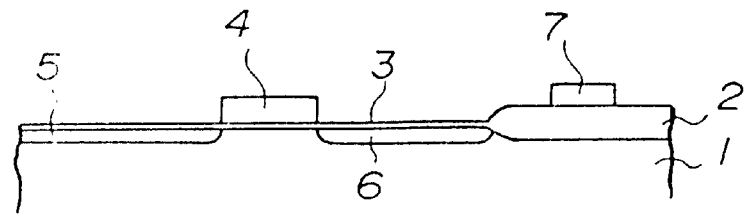

First Process (Refer to FIG. 12(A)):

The $SiO_2$ layer 2 which has a thickness of 3000 Å and becomes the field insulator layer is formed on the p-type silicon substrate 1 by a known LOCOS method. Thereafter, the $SiO_2$ layer 3 which has a thickness of 100 Å and becomes the gate oxide layer is formed on the entire surface by thermal oxidation. Next, a polysilicon layer having a thickness of 1500 Å is formed on the entire surface by CVD, and the polysilicon layer is selectively removed by use of a patterned resist mask (not shown) so as to form the gate electrodes 4 and 7. The gate electrodes 4 and 7 become word lines.

In addition, arsenic ions ($As^+$) are injected into the silicon substrate 1 using the gate electrode 4 as a mask. A thermal diffusion is made thereafter so as to form the $n^+$-type impurity diffusion layers 5 and 6. The $n^+$-type impurity diffusion layers 5 and 6 become the source/drain of a transfer transistor.

Figure 12B:
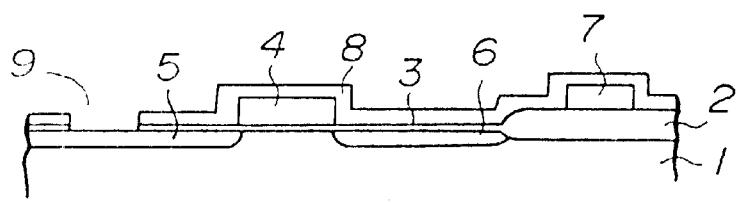

Second Process (Refer to FIG. 12(B)):

The $SiO_2$ layer 8 having a thickness of 1000 Å is formed on the entire surface by CVD. Then, the $SiO_2$ layers 3 and 8 are selectively removed using a patterned resist mask (not shown), so as to form the opening 9.

Figure 12C:
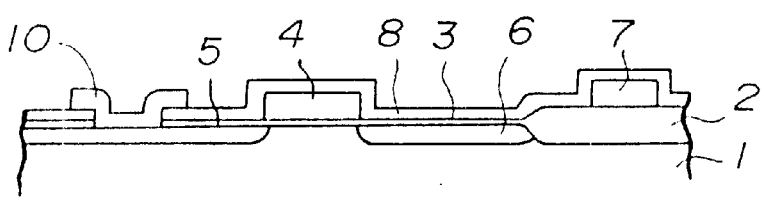
Figure 12D:
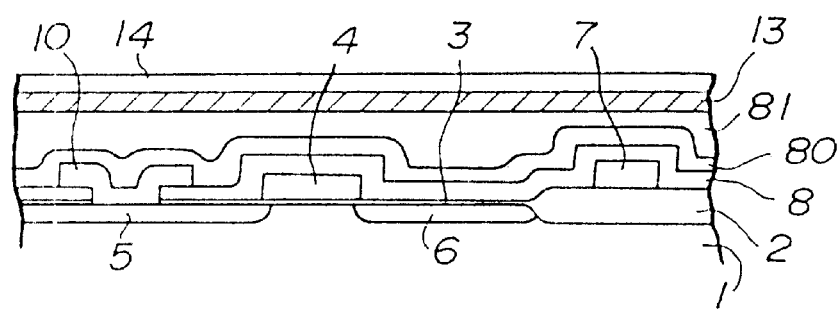

Third Process (Refer to FIG. 12(C)):

A polysilicon layer having a thickness of 500 Å and a tungsten silicide layer having a thickness of 1000 Å are successively formed on the entire surface by CVD. Then, the polysilicon layer and the tungsten silicide layer are selectively etched and removed using a patterned resist mask (not shown) so as to form the conductor layer 10 which becomes the bit line.

Fourth Process (Refer to FIG. 13(D)):

The SiO$_2$ layer 80 which has a thickness of 500 Å and is used as an insulator layer is formed on the entire surface by CVD. Thereafter, the polyimide layer 81 having a thickness of 500 Å is coated on the entire surface by spin-coating. Next, the polysilicon layer 13 which has a thickness of 500 Å and becomes the storage electrode is formed on the entire surface by CVD. In addition, the polyimide layer 14 having a thickness of 500 Å is coated on the entire surface by spin-coating.

Figure 12E:
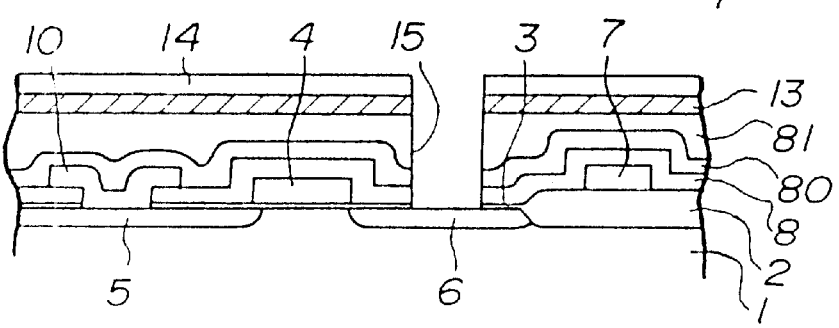

Fifth Process (Refer to FIG. 12(E)):

The polyimide layer 14, the polysilicon layer 13, the polyimide layer 81, and the SiO$_2$ layers 80, 8 and 3 are successively and selectively etched using a patterned resist mask (not shown), so as to form the opening 15.

Figure 13A:
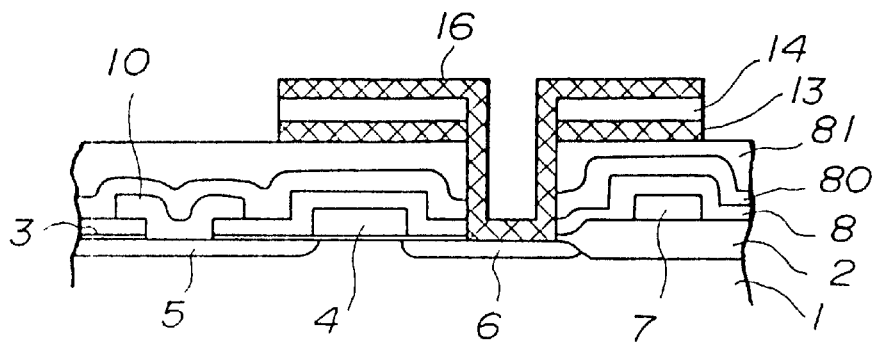

Sixth Process (Refer to FIG. 13(A)):

The polysilicon layer 16 which has a thickness of 500 Å and becomes the storage electrode is formed on the entire surface by CVD. Then, the polysilicon layer 16, the polyimide layer 14 and the polysilicon layer 13 are successively and selectively etched by an anisotropic etching using a patterned resist mask (not shown).

Figure 13B:
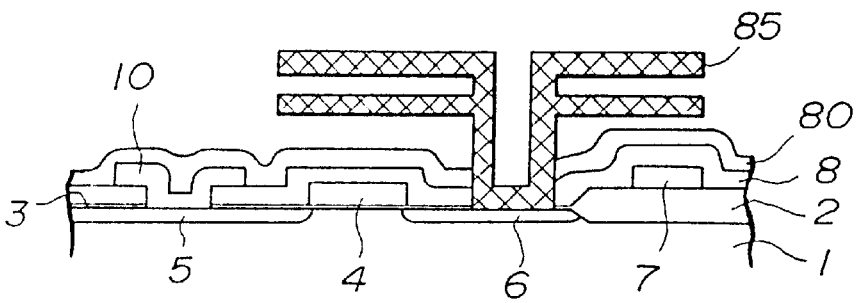

Seventh Process (Refer to FIG. 13(B)):

By removing the polyimide layers 14 and 81 by plasma ashing within an oxygen atmosphere, the storage electrode 85 having the storage electrode area of the memory cell three-dimensionally stacked is completed. In this state, the SiO$_2$ layer 80 acts as a mask with respect to the plasma ashing, and will not be removed.

Figure 13C:
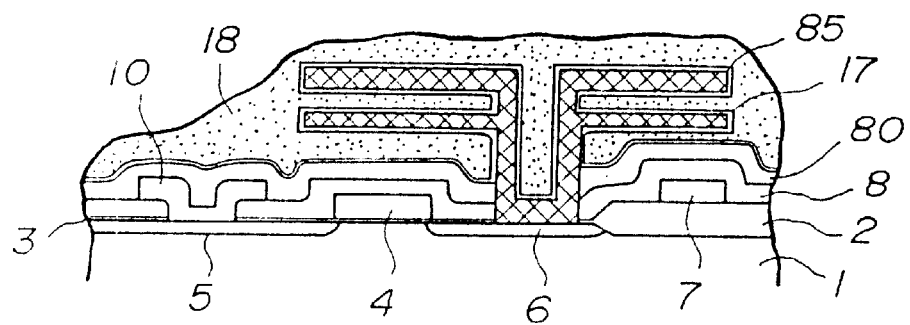

Eighth Process (Refer to FIG. 13(C)):

A Si$_3$N$_4$ layer having a thickness of 50 Å is formed on the entire surface by CVD. Then, a SiO$_2$ layer having a thickness of 20 Å is formed on the entire surface by thermal oxidation, so as to form the dielectric layer 17. Further, a polysilicon layer which is doped with impurity ions is formed on the entire surface by CVD, and the opposing electrode 18 is formed by patterning this doped polysilicon layer. Thereafter, the fin type capacitor is completed by carrying processes such as forming the interlayer insulator and the wiring layer.

In this embodiment, polyimide is used in order to form a fine which does not have concavo-convex parts. However, it is possible to use other materials such as polymer resins which can be spin-coated, has a high selective etching ratio with respect to polysilicon and oxide layers, and is head resistant so that it can withstand the high temperature at the time of thermal annealing or the like. In addition, the number of fins is not limited to two, and may be an arbitrary number.

Furthermore, although this embodiment forms the fin on the n$^+$-type impurity diffusion layer 6 which becomes the source/drain of the transfer transistor, the location of the fin is not limited to this case. For example, a draw-out electrode may be provided from the n$^+$-type impurity diffusion layers 5 and 6, and the fin may be formed on the SiO$_2$ layer 2 which isolates the element.

In addition, it is possible to etch the polysilicon and polyimide by the plasma etching using the same etchant if a mixed gas of chlorine and oxygen is used.

According to this embodiment, the top fin of the storage electrode is formed to a shape which does not include concavo-convex parts. For this reason, it is possible to facilitate the process of forming the opening. In addition, no short-circuit of the adjacent storage electrodes will occur when carrying out the patterning process, because it is possible to completely etch the polysilicon layers.

Figure 7A:
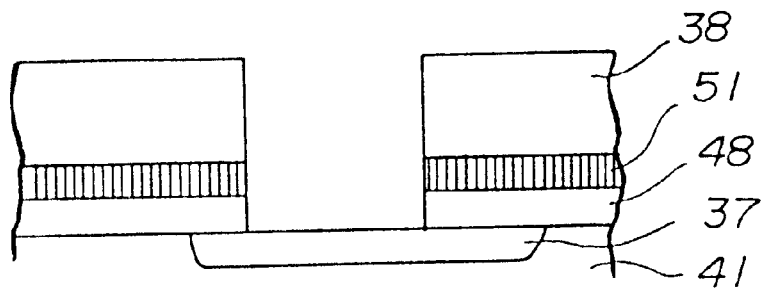
Figure 7B:
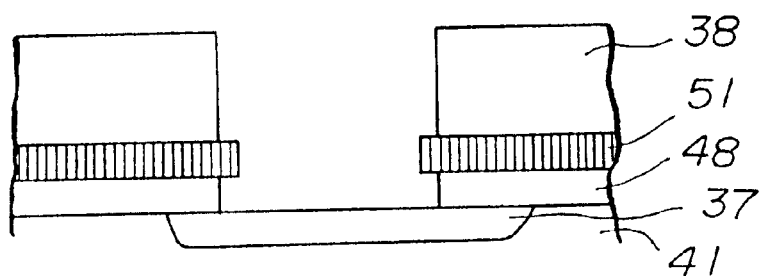
Figure 7C:
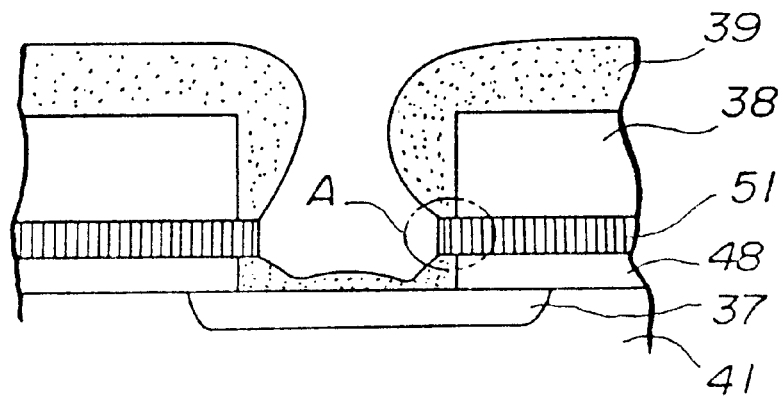

Moreover, since no nitride layer exists at the contact hole part, the disconnection of the Al layer described in conjunction with FIG. 7 will not occur. Accordingly, it is possible to stably produce a fine fin type capacitor cell with improved reliability and yield.

In each of the embodiments described above, the insulator, which forms the underlayer when forming the polysilicon layer which forms the capacitor fin, must be flat. However, it is possible to employ the following method, for example, other than the methods using the reflowed BPSG and PSG layers, the BSG layer, the SOG layer and the polyimide layer.

First, a nitride layer, which forms the underlayer, is formed on the entire surface by CVD. This nitride layer is used as an etching stopper layer with respect to the solution which is used at a subsequent process.

Then, an oxide layer is formed by CVD to a sufficient thickness on the CVD-formed nitride layer surface. At this stage, the surface of the oxide layer still reflects the undulations of the underlayer.

Next, a resist, which has a composition such that the etching rate is approximately the same as tat of the CVD-formed oxide layer, is spin-coated to a sufficient thickness on the CVD-formed oxide layer, so that the surface of the resist becomes planar regardless of the undulations of the underlayer. Such a resist is on the market and available.

Thereafter, the planar resist surface is uniformly etched back by plasma etching. In succession, the removal of the resist and the removal of the CVD-formed oxide layer are made, and the etch back of the CVD-formed oxide layer is stopped at an appropriate thickness. As a result, a CVD-formed oxide layer having planar surface and a desired thickness is obtained.

Then, the patterning of the opening, the depositing of the polysilicon outside the opening are carried out similarly to the above described embodiments, so that similar effects are obtained as in the above described embodiments.

In the memory cell of a large scale static random access memory (SRAM), there is a known method of producing a thin film transistor (TFT) which sandwiches a polysilicon channel by polysilicon gate electrodes by using the sidewall contact and efficiently utilizing the area. For example, IEDM Tech. Dig. (1991), p.477 proposes such a method.

Accordingly, in each of the above described embodiments, the method of etching the stacked layer of silicon oxide and polysilicon layers is rot limited to the semiconductor device having the fin type capacitor, and is also applicable to the method of producing a semiconductor device having the TFT which uses the sidewall contact.

However, in the embodiments, the etching process with respect to the stacked layer which is made up of stacked silicon oxide and polysilicon layers is carried out by alternately making a silicon oxide layer etching process (having selectivity with respect to the polysilicon layer) and a polysilicon layer etching process (having selectivity with respect to the silicon oxide layer). During the etching process with respect to each layer, it is necessary to make the so-called over-etching in order to compensate for the thickness distribution of the layer and the etching speed distribution and to completely remove each layer. In addition, an anisotropic etching is used to accurately transfer the resist pattern, but an over-etching is also required to remove a residual layer which is generated at the stepped part of the underlayer structure. For these reasons, the selectivity is necessary during the etching process with respect to each layer.

In the fin type capacitor, it is necessary to reduce the cell area and to reduce the area of the storage electrode in the plan view in order to improve the integration density. For this reason, it is necessary to increase the number of fins in order to secure a sufficient surface area of the storage electrode. For example, in the case of a 256 Mbit DRAM, five or more fins are required.

However, according to the production method described above, it requires for each fin two CVD processes for forming the polysilicon layer and the silicon oxide layer, two etching processes for etching the polysilicon layer and the silicon oxide layer in order to form the contact hole, and two etching processes for etching the polysilicon layer and the silicon oxide layer in order to pattern the storage electrode. In other words, the number of required processes increases at a rate of six times the number of fins to be provided. As a result, it is difficult to produce the device at a low cost.

In addition, defective parts caused by particles generated at each process accumulates and the yield and the reliability both become poorer as the number of processes increases. This problem may be eliminated to a certain extent by employing a multi-chamber production apparatus which successively etches the silicon oxide layer in a reaction chamber exclusively therefor and etches the polysilicon layer in a reaction chamber exclusively therefor by transporting the structure under vacuum. But such a multi-chamber production apparatus is extremely large and expensive, thereby making the production cost still high.

Hence, a description will now be given of embodiments of the method of producing the semiconductor device according to the present invention, in which the number of production processes can be reduced considerably and both the yield and reliability can be improved.

Figure 14:
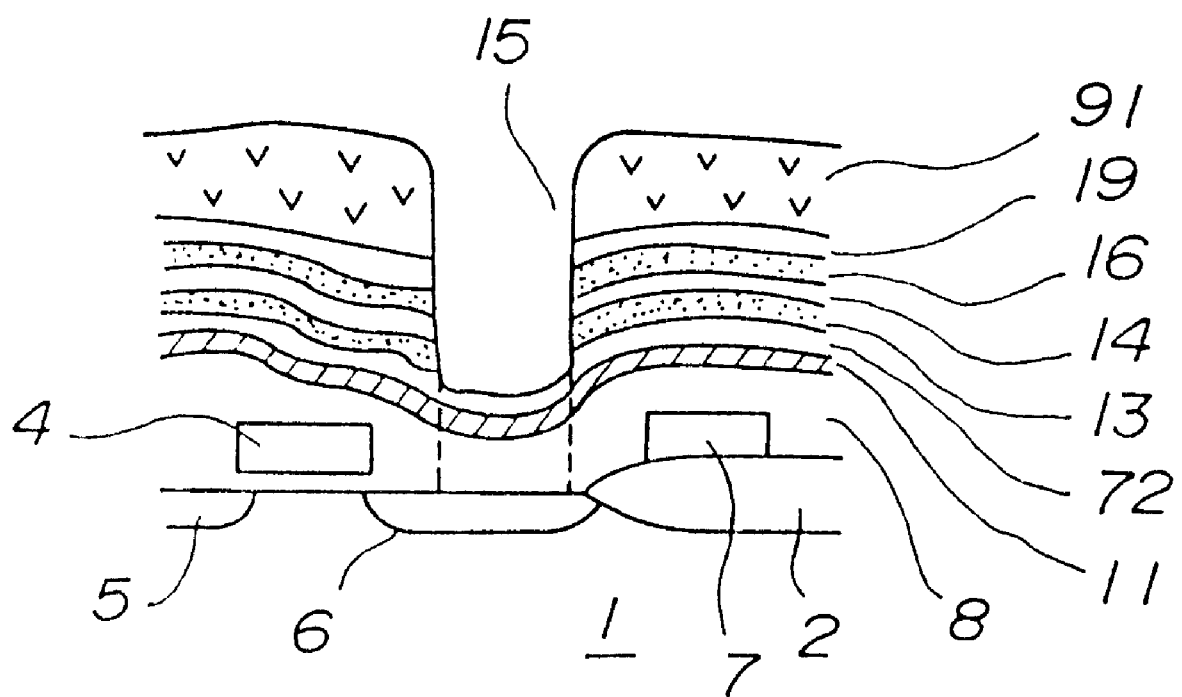
FIG. 14 is a cross sectional view for explaining a sixth embodiment of the method of producing the semiconductor device according to the present invention.

First, a description will be given of a sixth embodiment of the method of producing the semiconductor device according to the present invention, by referring to FIG. 14. In FIG. 14, those parts which are essentially the same as those corresponding parts in FIGS. 9 and 10 are designated by the same reference numerals, and a description thereof will be omitted.

As shown in FIG. 14, after forming an element isolation structure 2, a transfer transistor, a word line 4 and a bit line on a silicon substrate 1, a silicon oxide layer 8 having a thickness of 400 Å and a silicon nitride layer 11 having a thickness of 400 Å are formed by CVD. In addition, a silicon oxide layer having a thickness of 300 Å and a polysilicon layer having a thickness of 300 Å are alternately stacked (two times in this embodiment) by CVD to form silicon oxide layers 72 and 14 and polysilicon layers 13 and 16. A silicon oxide 19 having a thickness; of 300 Å is formed thereafter. Then, a resist layer 91 is coated on the entire surface, and the resist layer 91 is patterned to the shape of a contact hole. Next, the silicon oxide layers 14 and 72 and the polysilicon layers 16 and 13 are etched at approximately the same speed by RIE using $CF_4$ as the reactive gas. Light emission of CO is monitored, and the etching is stopped at a point in time when the etching of the silicon oxide layer 72 progresses to approximately one-half.

When the silicon oxide layer is being etched, increased light emission of CO and the like is observed if the light emission spectral of the etching plasma is analyzed. In addition, decreased light emission of F is observed when the polysilicon layer is being etched. Accordingly, it is possible to accurately control the amount of etching by making the etching while monitoring the progressed state of the etching as shown in FIG. 15.

Figure 15:
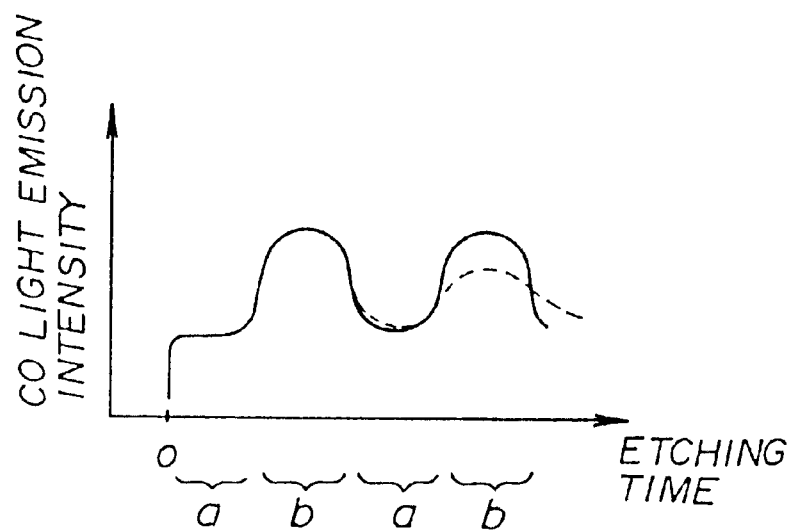
FIG. 15 is a diagram showing a monitored result of an etching state obtained by plasma light emission spectrum analysis.

In FIG. 15, the ordinate indicates the CO light emission intensity, the abscissa indicates the etching time, a time a indicates the etching time of the polysilicon layer, and a time b indicates the etching time of the silicon oxide layer. In addition, a dotted line in FIG. 15 shows a case where a stepped part exists at the surface and the area occupied by a sloping surface is large. In this case, the change in the CO generation decreases as the etching progresses as indicated by the dotted line. For this reason, it is desirable to make the planarization as in each of the embodiments described above.

Next, an etching process (selective ratio with respect to silicon is approximately 10) is carried out with respect to the silicon oxide layer using $CF_4+CHF_3$, and an opening 15 which reaches the silicon substrate 1 is formed as indicated by a dotted line in FIG. 14.

For example, when forming a capacitor having five fins in the above described manner, this embodiment only requires two processes (forming the contact hole 15 and patterning the fins) as opposed to nine etching processes which are required if the selective etching is employed, and the number of production processes can be reduced considerably.

According to the method of etching the stacked layer which is made up of the silicon oxide layer and the polysilicon layer under the condition that the etching speed of the silicon oxide layer and the etching speed of the polysilicon layer are approximately the same, the contact hole 15 may penetrate the thin source/drain diffusion layer 6 of the silicon substrate 1 as shown in FIG. 16. In this case, the intended contact cannot be achieved. In FIG. 16, those parts which are the same as those corresponding parts in FIG. 14 are designated by the same reference numerals, and a description thereof will be omitted.

However, the problem of FIG. 16 can positively be prevented by carrying out the etching at the same speed for the silicon oxide and polysilicon layers of the stacked layer until the etching of the lowermost polysilicon layer 13 ends, and then selectively etching the silicon oxide layer 72. If the underlayer structure of the region where the contact hole 15 is to be formed includes a stepped part, it is desirable to continue the etching at the same speed for the silicon oxide and polysilicon layers of the stacked layer until the lowermost polysilicon layer 13 is completely removed.

When forming the storage electrode by patterning the stacked layer of the silicon oxide layer and the polysilicon layer, a residual layer may be generated due to the stepped part beneath the stacked layer as indicated by 'A' on the left side of FIG. 17. When removing the silicon oxide layer between the fins which form the storage electrode using hycirofluoric acid, the residual polysilicon layer will lift off and become the source of defects. For this reason, it is necessary to eliminate this problem when forming the storage electrode.

In FIG. 17, those parts which are essentially the same as those corresponding parts in FIG. 14 are designated by the same reference numerals, and a description thereof will be omitted. In this case, since there are three fins, a polysilicon layer 93 is formed on the silicon oxide layer 19. BL denotes a bit line, and WL denotes a word line.

If a stepped part having an angle θ exists on the underlayer, a residual layer having a thickness $(1/\cos\theta - 1) \cdot T$ in a direction perpendicular to the substrate surface is generated at the stepped part as shown in FIG. 18 when an anisotropic etching is made to etch the stacked layer having a total thickness T. If the angle θ is large, the stacked layer of the silicon oxide layer and the polysilicon layer will remain, and the silicon oxide layer etching is required in order to remove this residual stacked layer. However, because the stacked layer (generally, the silicon oxide layer) underneath is already exposed at the flat part, there is a problem in that the underlayer structure will be etched when etching the silicon oxide layer.

Hence, in a seventh embodiment of the method of producing the semiconductor device according to the present invention, this problem is overcome by taking the following measures. That is, if the total thickness of the stacked layer is T and the lowermost polysilicor layer has a thickness t, the method includes a process of approximately planarizing the structure beneath the stacked layer so that a maximum angle θ of the stepped part satisfies the following formula (1).

$$\theta < \cos^{-1}(1-t/T) \quad (1)$$

By providing this process, the thickness of the residual layer in the direction perpendicular to the substrate surface becomes less than t/cos θ. In other words, the residual layer is made up solely of the polysilicon layer, thereby making it possible to easily remove the residual layer by the polysilicon layer etching process which has a slow etching speed with respect to the silicon oxide layer.

The formula (1) can be derived in the following manner. The vertical direction component of the thickness of the residual layer generated at the stepped part is (1/cos θ−1)·T as shown in FIG. 18. In addition, since the thickness of the lowermost polysilicon layer is t, its vertical direction component is t/cos θ.

Here, the object is to make the residual layer generated at the stepped part be made up solely of the polysilicon layer. Hence the following should be satisfied to achieve this object.

(1/cos θ−1)·T<t/cos θ

The formula (1) is thus obtained by transforming the above as follows.

(1−cos θ)·T<t

1−cos θ<t/T cos θ>1−t/T

Therefore, θ<cos$^{-1}$(1−t/T)

In this embodiment, when forming a fine type capacitor having five fins and in which the thicknesses of the silicon oxide layer and the polysilicon layer are the same, a planarization is made by coating SOG after forming the bit line, and the angle θ formed by the surface undulation and the substrate surface is made 27° or less. Of course, it is desirable that the angle θ is set even smaller.

Subsequent to forming the contact, hole 15 in the sixth embodiment, a polysilicon layer 93 having a thickness of 300 Å is formed by CVD as shown in FIG. 17. In addition, after coating a resist layer 91 on the entire surface, the resist layer 91 is patterned to the shape of the storage electrode. Then, the resist layer 91 is used as a mask, and the stacked layer which is made up of the silicon oxide layers 19, 14 and 72 and the polysilicon layers 93, 16 and 13 is etched by RIE using CF$_4$. This etching is made until the polysilicon layer 13 at the flat part is just removed. In this state, there is a possibility that only the polysilicon layer 13 remains at the stepped part as indicated by 'A' on the left side of FIG. 17. Hence, the residual polysilicon layer is etched by RIE using HBr, for example. As a result, it is possible to completely remove the polysilicon layer 13 by maintaining almost all of the silicon oxide layer 72 on the silicon nitride layer 11, as indicated on the right side of FIG. 17.

According to this embodiment, when forming the capacitor having five fins, only two processes (forming the contact hole 15 and patterning the fins) are required as opposed to nine etching processes which are required in the production method using the selective etching, and the number of required production processes can be reduced considerably, similarly to the sixth embodiment.

If the planarization using SOG is made, it may affect the metal wiring contact. For this reason, after forming the opposing electrode of the capacitor and removing the silicon nitride layer, the SOG may be removed if necessary. In this case, the removal of the SOG is facilitated if the selected SOG has an extremely high etching speed when HF is used. On the other hand, it is possible to select a fine SOG such that the problem of affecting the metal wiring contact is avoided.

Next, a description will be given of an eighth embodiment of the method of producing the semiconductor device according to the present invention.

If the angle θ in the seventh embodiment is relatively large, the silicon oxide layer 72 on the silicon nitride layer 11 will be etched when the etching is made to remove the residual layer at the stepped part. For this reason, this embodiment uses a thick silicon oxide layer 72 as shown in FIG. 19. In FIG. 19, those parts which are the same as those corresponding parts in FIG. 17 are designated by the same reference numerals, and a description thereof will be omitted.

When forming a capacitor having five fins by forming each of the silicon oxide layers 14 and 19 and the polysilicon layers 13, 16 and 93 to a thickness of 300 Å in a case where the angle θ of the stepped part is 30°, for example, a silicon oxide layer 72 having a thickness of approximately 620 Å is formed on the silicon nitride layer 11 as shown in FIG. 19. This thickness of approximately 620 Å includes a thickness B of 200 Å required to protect the silicon nitride layer 11, and a thickness C of approximately 420 Å which is provided for the over-etching. In this case, (1/cos θ−1)·T=420 Å because θ=30° and T=2700 Å.

Thereafter, the polysilicon layers 13, 16 and 93 respectively having the thickness of 300 Å and the silicon oxide layers 14 and 19 respectively having the thickness of 300 Å are alternately formed.

When forming the storage electrode, the polysilicon and silicon oxide layers are etched at the same etching speed by RIE using CF$_4$ as the etchant gas. The residual later at the stepped part is completely removed by carrying out an over-etching amounting to 420 Å after the etching of the last polysilicon layer 13 ends. Since the silicon oxide layer 72 amounting to 200 Å remains on the silicon nitride layer 11, it is possible to prevent the structure underneath from being damaged by a HF process which is carried thereafter.

In this embodiment, only one process (patterning the fins) is required to form the capacitor having five fins as opposed to nine etching processes which are required in the method which uses the selective etching, and the number of required production processes can be reduced considerably.

Next, a description will be given of a ninth embodiment of the method of producing the semiconductor device according to the present invention.

In this embodiment, if the angle θ of the stepped part is 35°, for example, when patterning the storage electrode of the fin type capacitor, the etching of the polysilicon and silicon oxide layers at the same etching speed is stopped after etching three polysilicon layers and two silicon oxide layers because the normalized thickness of the stepped part in the vertical direction is 1/(1−cos θ)=5.5. In this state, the silicon oxide layer is exposed at the flat part. Hence, the polysilicon layer at the stepped part is removed by a polysilicon layer etching process using HBr. It is sufficient that the amount of the polysilicon layer etching corresponds to one silicon oxide layer.

Next, the etching at the same etching speed is stopped after etching one polysilicon layer. Finally, a polysilicon layer etching using HBr is made to remove the polysilicon layer at the stepped part, and the etching process is thereby completed.

According to this embodiment, it is possible to reduce the number of etching process to four from nine etching processes which are required when the selective etching is used.

In the embodiments described above, $CF_4$ is used as an example of the etchant gas which enables the etching of the polysilicon and silicon oxide layers at the same etching speed. However, it is possible to use other etchant gases as long as the silicon oxide layer and the polysilicon layer are anisotropically etched at approximately the same etching speed.

In addition, it is possible to planarize the underlayer by reflowing BPSG or carrying out $TEOS/O_3$ CVD. Furthermore, the number of fins may be selected depending on the characteristic of the device, and the combination of the etching conditions may be easily selected within the scope of the present invention.

The HBr plasma etching is explained as an example of the selective etching of the pclysilicon layer, however, it is possible to use Cl or F system etching. In addition, the selective etching of the silicon oxide layer is not limited to that using $CF_4+CHF_3$, and it is possible to use $CF_4+CH_2F_2$, $CF_4+C_4F_8+CH_2F_2$ or the like.

Moreover, although RIE is used for the etching process in the described embodiments, it is possible to obtain satisfactory results using a process carried out under a magnetic field such as ECR.

The method of controlling the amount of etching is not limited to monitoring the plasma light emission, and other methods such as changing the pressure, changing the electrode voltage and employing the light interference may also be used.

Next, a description will be given of a first embodiment of a semiconductor device according to the present invention.

Figure 4A:
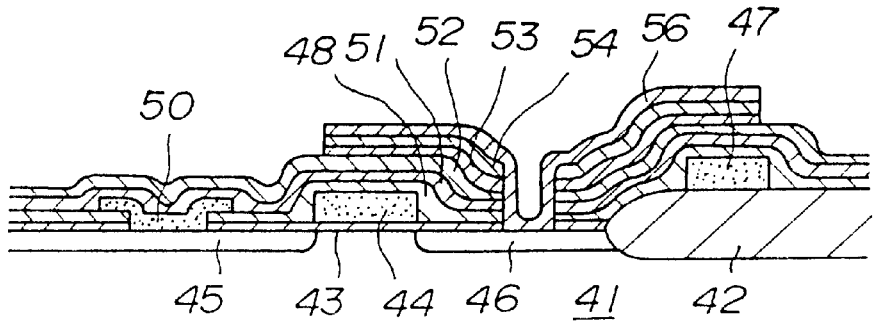
Figure 4B:
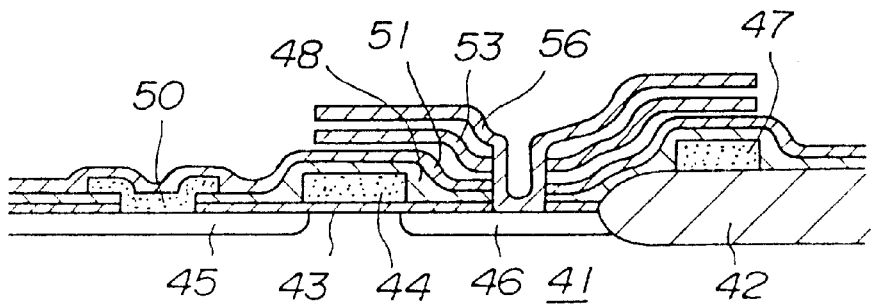
Figure 4C:
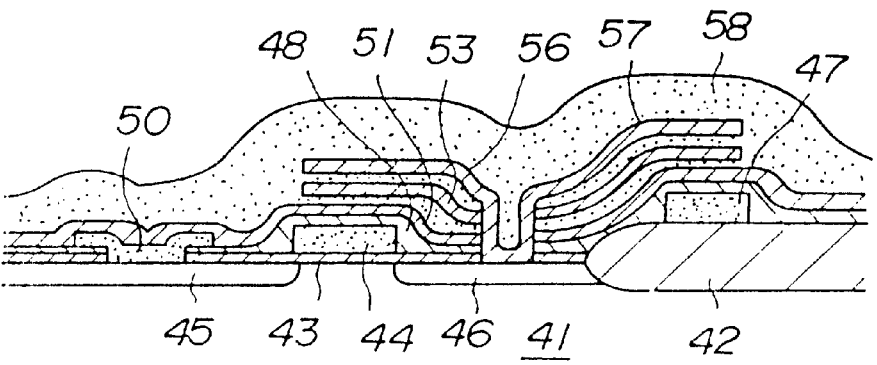
Figure 5A:
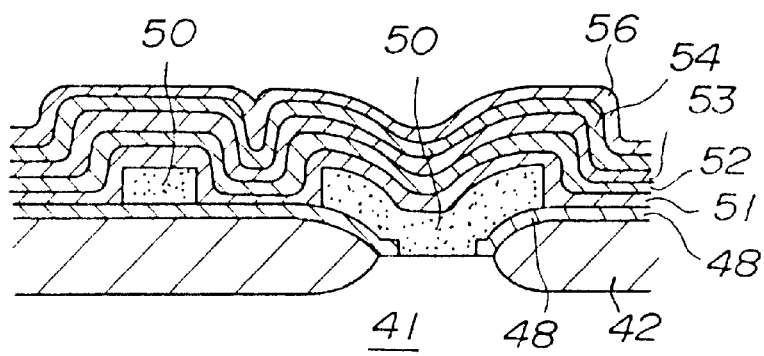
Figure 5B:
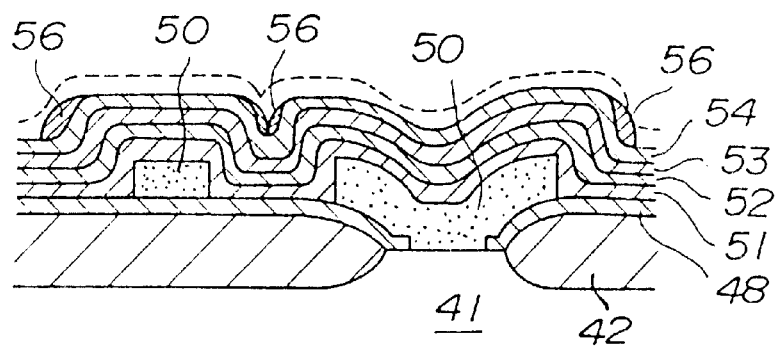
Figure 5C:
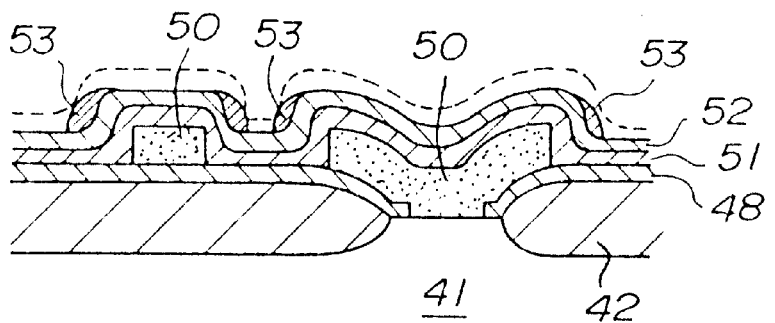

This first embodiment of the semiconductor device has the structure shown in FIG. 10(C). In other words, the conductor layers 13 and 16 which form the fins of the fin type capacitor respectively extend approximately parallel to the surface (top surface) of the substrate 1. The shape of the fins are different from that of the prior art shown in FIG. 4(C), for example. In addition, the thickness of the opposing electrode 18 under the conductor layer 13 is not constant in this embodiment, and is thicker towards the contact hole 15. On the other hand, according to the prior art shown in FIG. 4(C), the thickness of the opposing electrode 58 under the conductor layer 53 is approximately constant.

Second and third embodiments of the semiconductor device according to the present invention are respectively shown in FIGS. 11(E) and 13(C). These embodiments of the semiconductor device also have the fin features of the first embodiment of the semiconductor device. In addition, with regard to the third embodiment of the semiconductor device, the features of the opposing electrode is also the same as the first embodiment of the semiconductor device.

Further, the present invention is not limited to these embodiments, but various variations and modifications may be made without departing from the scope of the present invention.

What is claimed is:

1. A semiconductor device, comprising:
    a substrate having a top surface;
    an impurity diffusion region formed in said substrate and having a conductivity type opposite to that of said substrate;
    a first insulator layer provided on the top surface of said substrate and having a contact hole;
    a storage electrode electrically coupled to said impurity diffusion region via the contact hole in said first insulator layer, said storage electrode including a first part which extends upwards from the top surface of said substrate, and a second part which makes contact with the first part and extends approximately parallel to the top surface of said substrate, said storage part including a plurality of mutually separated conductor layers;
    a second insulator layer covering said storage electrode; and
    an opposing electrode electrically insulated from said storage electrode by said second insulator layer, said opposing electrode including a portion existing under a lower surface of a lowermost one of the conductor layers of the second part of said storage electrode, a portion above an upper surface of an uppermost one of the conductor layers of the second part, and a portion between the mutually separated conductor layers of the second part,
    wherein a thickness of the portion of said opposing electrode existing under the lower surface of the lowermost one of the conductor layers of the second part of said storage electrode is greater than a thickness of the portion of said opposing electrode existing between the mutually separated conductor layers of the second part.

2. The semiconductor device as claimed in claim 1, wherein said first insulator layer includes a top surface which is approximately parallel to the top surface of said substrate.

3. The semiconductor device as claimed in claim 2, wherein said first insulator layer is made of a material including at least one of boron and phosphor.

4. The semiconductor device as claimed in claim 2, wherein said first insulator layer comprises Spun On Glass (SOG).

5. A semiconductor device comprising:
    a substrate having a top surface;
    an impurity diffusion region formed in said substrate and having a conductivity type opposite to that of said substrate;
    a first insulator layer provided on the top surface of said substrate, said first insulator comprising a stepped part and a contact hole, said stepped part having a maximum angle θ with respect to the top surface of the substrate;
    a storage electrode electrically coupled to said impurity diffusion region via the contact hole in said first insulator layer, said storage electrode including a first part which extends upwards from the top surface of said substrate, and a second part which makes contact with the first part and extends approximately parallel to the top surface of said substrate, said second part including a plurality of mutually separated conductor layers;
    a second insulator layer covering said storage electrode; and
    an opposing electrode electrically insulated from said storage electrode by said second insulator layer,
    said opposing electrode including a portion existing under a lower surface of a lowermost one of the conductor layers of the second part of said storage electrode, a portion above an upper surface of an uppermost one of the conductor layers of the second part, and a portion between the mutually separated conductor layers of the second part, wherein said portion of said opposing electrode located under the lower surface of the lowermost one of the conductor layers of the second part of said storage electrode has a thickness greater than or equal to $(1/\cos \theta - 1) \cdot T$, where T denotes a distance from under the lower surface of the lowermost one of the conductor layers of the second part of said storage electrode to above the upper surface of the uppermost one of the conductor layers of the second part.

6. The semiconductor device as claimed in claim 5, wherein said first insulator layer comprises a material including at least one of boron and phosphor.

7. The semiconductor device as claimed in claim 5, wherein said first insulator layer comprises Spun on Glass (SOG).

8. A semiconductor device comprising:

a substrate having a top surface;

an impurity diffusion region formed in said substrate and having a conductivity type opposite to that of said substrate;

a first insulator layer provided on the top surface of said substrate, said first insulator comprising a stepped part and a contact hole, said stepped part having a maximum angle $\theta$ with respect to the top surface of said substrate;

a storage electrode electrically coupled to said impurity diffusion region via the contact hole in said first insulator layer, said storage electrode including a first part which extends upwards from the top surface of said substrate, and a second part which makes contact with the first part and extends approximately parallel to the top surface of said substrate, said second part including a plurality of mutually separated conductor layers;

a second insulator layer covering said storage electrode; and an opposing electrode electrically insulated from said storage electrode by said second insulator layer, said opposing electrode having a portion existing under a lower surface of a lowermost one of the conductor layers of the second part of said storage electrode, a portion above an upper surface of an uppermost one of the conductor layers of the second part, and a portion between the mutually separated conductor layers of the second part, wherein a relationship $\theta < \cos^{-1}(1-t/T)$ stands, where t denotes a thickness of the lowermost one of the conductor layers of the second part of said storage electrode, and T denotes a distance from the lower surface of the lowermost one of the conductor layers of the second part of said storage electrode to the upper surface of the uppermost one of the conductor layers of the second part.

9. The semiconductor device as claimed in claim 8, wherein said first insulator layer comprises a material including at least one of boron and phosphor.

10. The semiconductor device as claimed in claim 8, wherein said first insulator layer comprises Spun On Glass (SOG).

11. A semiconductor device comprising:

a substrate having a top surface;

an impurity diffusion region formed in said substrate and having a conductivity type opposite to that of said substrate;

a first insulator layer provided on the top surface of said substrate, said first insulator comprising a contact hole;

a storage electrode electrically coupled to said impurity diffusion region via the contact hole in said first insulator layer, said storage electrode comprising a first part which extends upwards from the top surface of said substrate, and a second part which makes contact with the first part and extends approximately parallel to the top surface of said substrate;

a second insulator layer covering said storage electrode; and an opposing electrode electrically insulated from said storage electrode by said second insulator layer, said opposing electrode having a portion existing under a lower surface of the second part of said storage electrode, said portion of said opposing electrode existing under the lower surface of the second part having a thickness which is non-uniform such that the thickness becomes a maximum in a vicinity of the contact hole.

12. The semiconductor device as claimed in claim 11, wherein second part of said storage electrode comprises:

a plurality of mutually separated conductor layers.

13. The semiconductor device as claimed in claim 11, wherein said first insulator layer comprises a top surface which is non-planar with respect to the top surface of said substrate.

14. The semiconductor device as claimed in claim 11, which further comprises:

a third insulator layer made of silicon nitride which is provided above said first insulator layer and under the portion of the opposing electrode existing under the lower surface of the second part of said storage electrode.

* * * * *